(12) United States Patent
Ogino

(10) Patent No.: US 7,547,562 B2
(45) Date of Patent: Jun. 16, 2009

(54) LIGHT EMITTING DEVICE AND METHOD FOR MANUFACTURING SAME

(75) Inventor: Kiyofumi Ogino, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 10/229,132

(22) Filed: Aug. 28, 2002

(65) Prior Publication Data

US 2003/0042849 A1 Mar. 6, 2003

(30) Foreign Application Priority Data

Aug. 29, 2001 (JP) .............................. 2001-259953

(51) Int. Cl.
*H01L 21/00* (2006.01)
(52) U.S. Cl. ..................... 438/22; 438/99; 438/149; 257/E33.001
(58) Field of Classification Search .................. 438/22, 438/29, 30, 99, 141, 149, 14; 313/506; 428/690; 427/66, 248.1
See application file for complete search history.

(56) References Cited

U.S. PATENT DOCUMENTS

| | | | |
|---|---|---|---|
| 6,384,427 B1 | 5/2002 | Yamazaki et al. | |
| 6,390,874 B2 * | 5/2002 | Mizutani et al. | 445/24 |
| 6,500,604 B1 | 12/2002 | Dimitrakopoulos et al. | |
| 6,506,616 B1 | 1/2003 | Kim et al. | |
| 6,559,594 B2 | 5/2003 | Fukunaga et al. | |
| 6,566,156 B1 | 5/2003 | Sturm et al. | |
| 6,566,806 B1 | 5/2003 | Kawai | |
| 6,592,933 B2 * | 7/2003 | Himeshima et al. | 427/66 |
| 6,620,528 B1 | 9/2003 | Yamazaki et al. | |
| 6,768,260 B2 | 7/2004 | Fukunaga et al. | |
| 6,776,880 B1 | 8/2004 | Yamazaki | |
| 6,830,494 B1 | 12/2004 | Yamazaki et al. | |
| 2001/0006827 A1 | 7/2001 | Yamazaki et al. | |
| 2002/0093286 A1 * | 7/2002 | Ohshita et al. | 313/506 |
| 2003/0006699 A1 | 1/2003 | Ogino et al. | |
| 2005/0029935 A1 | 2/2005 | Ogino et al. | |

FOREIGN PATENT DOCUMENTS

| | | |
|---|---|---|
| EP | 0 892 028 | 1/1999 |
| JP | 11-54270 | 2/1999 |
| JP | 2001-49422 | 2/2001 |

* cited by examiner

*Primary Examiner*—Savitri Mulpuri
(74) *Attorney, Agent, or Firm*—Eric J. Robinson; Robinson Intellectual Property Law Office, P.C.

(57) ABSTRACT

The object is to provide a method for realizing to selectively form a film in the manufacture of a light-emitting device using a polymer organic compound. The invention is characterized in that the application liquid having an organic compound dissolved in a solvent is applied onto a substrate having a mask thereby forming an organic compound layer of a plurality of materials. Furthermore, a sucker is provided to place the mask in sufficient contact with the substrate without causing positional deviation during film forming, thereby making possible to form an organic compound layer with accuracy.

14 Claims, 13 Drawing Sheets

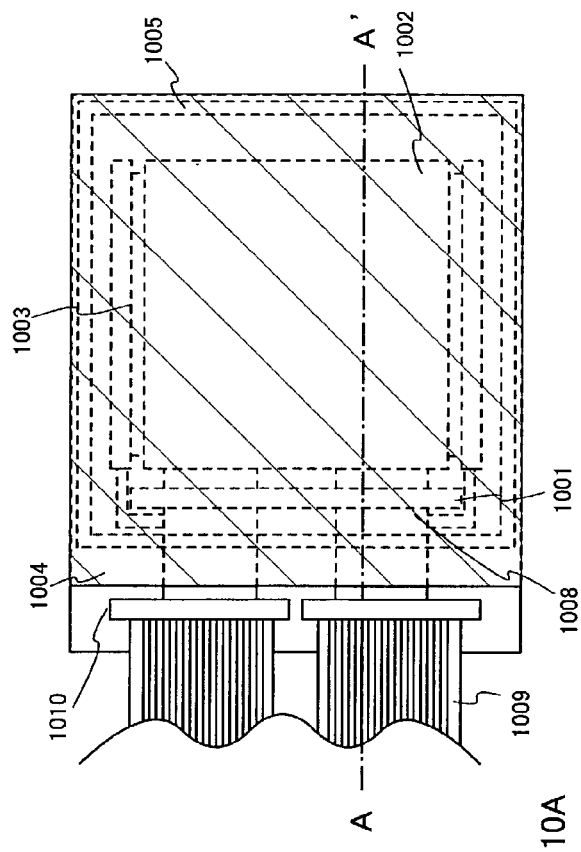
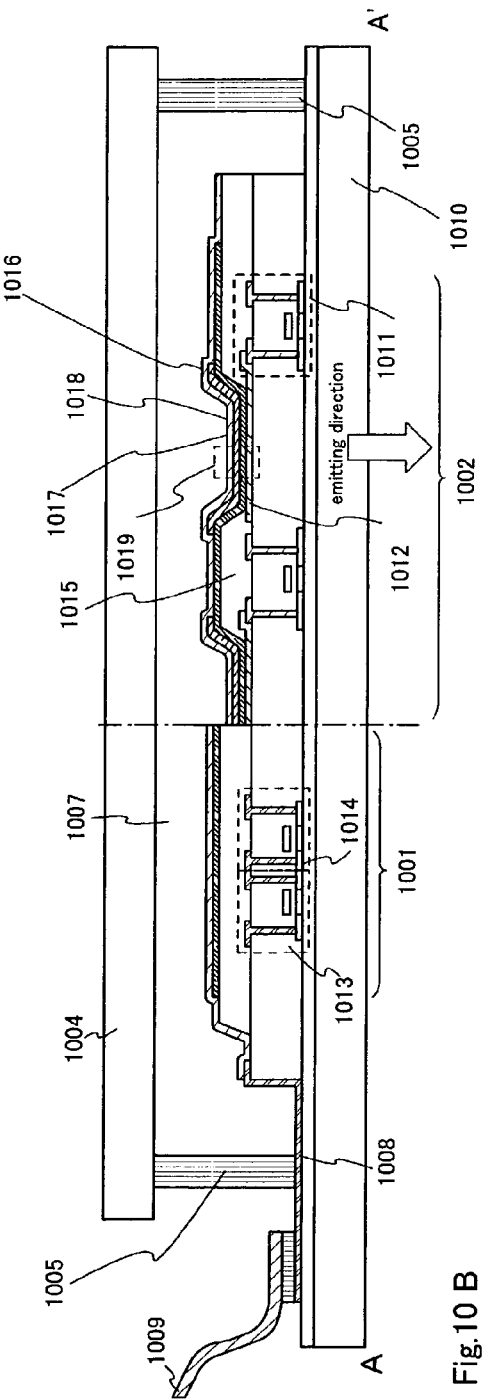
Fig. 10A
Fig. 10B

LIGHT EMITTING DEVICE AND METHOD FOR MANUFACTURING SAME

BACKGROUND OF THE INVENTION

1. Technical Field of the Invention

This invention relates to a light-emitting device using a light-emitting element capable of obtaining fluorescence or phosphorescence by applying an electric field to an element having a film containing an organic compound (hereinafter, described "organic compound layer") provided between a pair of electrodes, and to a method for manufacturing same. The light-emitting device of the present invention refers to an image display device or light-emitting device using light-emitting elements. The light emitting device includes all of, for example, a module having a light-emitting element attached with a connector, e.g. anisotropic conductive film (FPC: Flexible Printed Circuit), TAB (Tape Automated Bonding) tape or TCP (Tape Carrier Package), a module having a printed board provided at an end of a TAB tape or TCP, and a module having an IC (Integrated Circuit) directly mounted on a light-emitting element by a COG (Chip On Glass) scheme.

2. Description of the Prior Art

The light-emitting element using an organic compound, having the features of thin and light weight, high-speed response, d.c. low-voltage driving, etc., is expected for the application to a flat panel display in the next generation. Particularly, the display device having light-emitting elements arranged in a matrix form is considered superior to the conventional liquid crystal display device in respect of its wide viewing angle and hence excellent visibility.

It is considered that the light-emitting element has a light-emission mechanism that, by applying a voltage to a pair of electrodes sandwiching an organic compound, the electrons injected from the cathode and the holes injected from the anode recombine at luminescent centers in an organic compound layer to form molecular excitons whereby the molecular exciton, upon returning to a ground state, gives off energy thus providing light emission. The excited state is known singlet excitation and triplet excitation. Light emission is considered possible to take place through any of the excitation states.

The light-emitting device, having such light-emitting elements arranged in a matrix form, can employ a drive method of passive matrix driving (simple matrix type) and active-matrix driving (active-matrix type). However, it is considered that, where the density of pixels increases, advantageous is the active-matrix type having switches on a pixel-by-pixel (or dot-by-dot) basis because of its capability of low voltage driving.

For the organic compound for an organic compound layer (exactly light-emitting layer) considered also as the core of light-emitting element, studies have being made on the smaller-molecular organic compounds and the polymer organic compounds. Attentions are drawn to the polymer organic compounds easier to handle and high in heat resistance than the smaller-molecular organic compounds.

There are known the spin coating technique, the ink-jet technique and deposition technique, as the methods to form a film of such an organic compound. In the case of using a polymer organic compound, it is a usual practice to carry out film forming by the use of the spin coating or ink jet technique.

However, the spin coating technique is to apply an application liquid by dripping it onto a substrate and then rotating the substrate at high velocity. This is excellent in respect of obtaining an even thickness of formed film. However, there is difficulty in delimiting the area of film forming. Hence, there is a drawback that a film can be formed only in one kind of organic compound on one substrate surface.

On the contrary, the ink jet technique is to apply an application liquid onto a film-forming area by the use of an ink head having an alignment mechanism. This, accordingly, allows for forming a film with using a plurality of kinds of organic compounds on one substrate surface, thus being excellent in realizing full-color display.

In the ink jet technique, however, where fabricating a full-color flat panel display with the light-emission colors of red, green and blue, there is a need of the exclusive units including a high-accuracy stage, an automated alignment mechanism and ink head.

Meanwhile, the ink jet technique is to eject and fly a polymer organic compound. Accordingly, in case the distance is improper between an application surface and an ink-jet head nozzle, there possibly occurs a problem of so-called curve fly, i.e. droplet arriving at unwanted point.

Furthermore, the ink jet scheme is to eject an ink containing an organic compound through a nozzle. Consequently, there arises a problem of nozzle clogging with an increased viscosity of ink. Contrary to this, where lowering the ink viscosity, lowered is the concentration of an organic compound contained in the ink, resulting in a reduced thickness of a formed film. Thus, there encounters a problem that the function is not available fully or increased frequency of ink ejection.

Concerning nozzle clogging, the problem is to be eliminated by increasing the nozzle diameter. This, however, includes a defect of making it impossible to provide patterning with precision, on the other hand.

It is noted that the curve fly and nozzle clogging as noted above are described in detail in Japanese Patent Laid Open No. 11-54270.

Meanwhile, when forming a pattern by using an ink jet method, in order to enhance film-forming accuracy there is also a need to form a bank with a height on a film-forming surface or making a surface treatment. Specifically, the substrate is exposed to a plasma to make only the bank surface ink-repellent, thus allowing ink to arrive at a desired point.

However, the ink jet technique, requiring the use of an ink-jet device as above, ink optimization and treating a film-forming surface, is not to be considered as a best suited film-forming method. There is a problem in easiness in the manufacture.

Therefore, it is an object of the present invention to enable film-forming of an organic compound layer in a desired position thereby forming an even film thickness of an organic compound layer when film-forming an organic compound layer of a polymer organic compound by using a spin coat technique, and further to form a plurality of organic compound layers on the same surface easier than the formation using the ink jet scheme.

SUMMARY OF THE INVENTION

The present invention is characterized in that it is possible to form an organic compound of a plurality of organic compound or a plurality of organic compounds of different organic compounds by applying an application liquid onto a substrate having a mask. In the invention, the mask provided on the substrate is close contacted with the substrate by a sucker and fixed not to be positionally deviated during film-forming, thereby enabling to form an organic compound with accuracy.

Because the invention forms a film particularly by using a spin coat technique, film-forming can be made in a brief time and a film can be formed with greater evenness. In the case the invention forms an organic compound layer, alignment is made between an application position over the substrate and a mask opening and thereafter a film is formed by applying an application liquid over the substrate.

The structure of a manufacturing method disclosed in the present description is a method for manufacturing a light-emitting device comprising: providing a mask on a surface of a substrate; aligning an application position of the substrate with an opening of the mask; providing a sucker on a back surface of the substrate; fixing the mask by the sucker; and applying an application liquid over the substrate by a spin coat technique to form an organic compound layer in the application position.

Another structure of a manufacturing method disclosed in the present description is a method for manufacturing a light-emitting device comprising: forming a thin film transistor on a substrate; forming an electrode electrically connected to the thin film transistor; providing a mask on the electrode; aligning an application position over the electrode with an opening of the mask; providing a sucker on a back surface of the substrate; fixing the mask by the sucker; and applying an application liquid over the electrode by a spin coat technique to form an organic compound layer in the application position.

Also, each of the above structures is characterized in that the application liquid, having a particularly polymer organic compound of among organic compounds as an application liquid dissolved in a protic or aprotic solvent, is applied over a substrate having a mask formed of a magnetic material by a spin coat technique, thereby forming a film in a desired area over the substrate. By forming a film using a spin coat technique, the film to be formed can be improved in evenness.

Incidentally, in the above structures, the mask to be arranged over the substrate has a structure having an opening only in an application position over the substrate.

In the above structures, a mask formed of a magnetic material in a part or the entire thereof (hereinafter, referred to as a metal mask) can be used in order to attract and contact the mask onto and with the substrate. The materials suited as a magnetic material for forming a mask include martensitic or ferritic stainless steel, besides iron, titanium or an alloy containing these. As a concrete steel kind is suited 13-chromium based stainless steel containing 13% of chromium in iron or 18-chromium based stainless steel containing 18% of chromium (SUS410, SUS420, SUS430 or the like (JIS standard)).

Meanwhile, in the above structure, when holding and fixing the metal mask on the substrate, the metal mask is placed over a surface of the substrate. In a state alignment is made between the substrate and the metal mask, a sucker is moved toward a back surface of the substrate. This fixes the metal mask. As a result, the substrate is clamped by the sucker and the metal mask. Namely, the sucker can hold and fix the metal mask over the substrate.

Furthermore, in the above structure, in the case that the metal uses a metal mask, the sucker can use a magnet. In the case the magnet uses a permanent magnet, the permanent mask must have such a force to fix the metal mask over the substrate as to provide an adhesion force the metal mask is not to shift sideways. Consequently, the permanent magnet herein satisfactorily has a magnetic flux density of 1000-30000 gausses.

Furthermore, in the above structure, the magnetic materials include cast or sintered alnico magnet, ferrite magnet, iron, chromium or cobalt magnet, rare-earth cobalt magnet such as samarium-cobalt (Sm—Co) magnet, and neodymium-iron-boron based magnet (including neodymium-iron-boron magnet).

Incidentally, according to the metal mask close-contact structure as above, the magnetism of the magnet prevents the metal mask entirety from being closely contacted with the substrate and floating up. Where pixel pattern increases precision, even when the metal mask is reduced in thickness and lowered in rigidity, it is possible to prevent against a positional deviation of an organic compound layer formed over the substrate or an intrusion of application liquid.

Incidentally, the above structure is characterized in that the magnet is arranged in a position having an area overlapped with the metal mask.

In the above structure, the magnet can be provided in plurality and alternately arranged such that adjacent magnets are reverse in magnetization direction. In this case, arrangement is made in a stripe form such that one side of the metal mask is parallel with a lengthwise direction of the plurality of magnets.

Furthermore, in the above structure, the metal mask arranged on a surface side of the substrate can be fixed by a magnet (permanent magnet) placed on a back surface side of the substrate so that the metal mask is used in combination with the electromagnet for controlling a magnitude of a magnetic force of the magnet when it is close contacted with the surface of the substrate.

In this case, the electromagnet is arranged correspondingly to a position the permanent magnet is arranged, to be structurally arranged coincident in axis between the permanent magnet and the electromagnet.

Meanwhile, in the invention, after the electromagnet is energized to weaken the magnetic force of the permanent magnet, the permanent magnet is moved toward or away from the back surface of the substrate whereby the metal mask can be attached or the substrate can be removed.

Furthermore, of the organic compounds to be used in the above structure, the polymer organic compound having hole injectability soluble in a protic solvent refers, principally, to a polymer organic compound soluble in water, specifically PEDOT (poly(3,4-ethylene dioxythiophene)), polyaniline (PANI), and the like.

The polymer organic compound, soluble in an aprotic solvent for forming an organic compound layer in the above structure, is characterized by one or a plurality of the substances soluble in an organic solvent selected from polyparaphenylene vinylene derivative, polythiophene derivative, polyfluorene derivative, polyparaphenylene derivative, polyalkylphenylene and polyacetylene derivative.

The polyparaphenylene vinylene derivative can use a material of poly(2,5-dialkoxy-1,4-phenylene vinylene): RO-PPV or poly(2-dialkoxyphenyl-1,4-phenylene vinylene): ROPh-PPV, specifically poly(2-methoxy-5-(2-ethyl-hexoxy)-1,4-phenylene vinylene): MEH-PPV or poly(2,5-dimethyloxtyl-silyl-1,4-phenylene vinylene): DMOS-PPV.

The polyparaphenylene derivative can use poly(2,5-dialkoxy-1,4-phenylene): RO-PPP.

The polythiophene derivative can use a material of poly(3-alkylthiophene): PAT, specifically poly(3-hexylthiophene): PHT or poly(3-cyclohexylthiophene): PCHT. Besides, can be used poly(3-cyclohexyl-4-methylthiophene): PCHMT, poly (3-[4-oxtylphenyl]-2,2' bitiophene): PTOPT, poly(3-(4-oxtylphenyl)-tiophene): POPT-1, or the like.

The polyfluorene derivative can use a material of poly (dialkylfluorene): PDAF, specifically poly(dioctylfluorene): PDOF.

The polyacetylene derivative can use a material of polypropyl phenylacetylene: PPA-iPr, polybutylphenyl acetylene: PDPA-nBu, or polyhexylphenyl acetylene: PHPA.

Meawhile, the polymer organic compound soluble in an aprotic solvent in the above structure includes those, whose precursor is soluble in an aprotic solvent and, after film forming by a spin coat technique, can be polymerized by a heating process.

Meanwhile, the aprotic solvent to be used in the above structure, is characterized by one or a plurality selected from toluene, benzene, chlorobenzene, dichlorobenzene, chloroform, xylene, anisole, dichloromethane, cyclohexane, NMP (N-methyl-2-pyrrolidone), dimethyl sulfoxide, cyclohexanone, dioxane and THF (tetrahydrofuran).

In the above structure, the organic compound layer is characterized by being formed in an inert gas atmosphere of nitrogen, argon or the like. The concentration of oxygen is kept at 500 ppm or lower.

The light-emitting device obtained by carrying out a method of the invention has a structure characterized by a light-emitting device having a plurality of light-emitting elements, the light emitting device comprising: a first light-emitting element having a first organic compound layer formed in contact with a first anode, a second organic compound layer formed in contact with the first organic compound layer and a cathode formed in contact with the second organic compound layer; and a second light-emitting element having the first organic compound layer formed in contact with a second anode, a third organic compound layer formed in contact with the first organic compound layer and the cathode formed in contact with the third organic compound layer; whereby the cathode is formed in a position overlapped with and in a same film as the first and second anodes.

In the above structure, the first organic compound layer is characterized by being formed in a position overlapped with and in a same film as the first and second anode.

Meanwhile, another structure is characterized by a light-emitting device having a plurality of light-emitting elements, the light emitting device comprising: a first light-emitting element having a first organic compound layer formed in contact with a first anode, a second organic compound layer formed in contact with the first organic compound layer and a cathode formed in contact with the second organic compound layer; and a second light-emitting element having the first organic compound layer formed in contact with a second anode, a third organic compound layer formed in contact with the first organic compound layer and the cathode formed in contact with the third organic compound layer; whereby the first light-emitting element and the second light-emitting element exhibit different light-emission colors.

Meanwhile, another structure is characterized by a light-emitting device having a plurality of light-emitting elements, the light emitting device comprising: a first light-emitting element having a first organic compound layer formed in contact with a first anode, a second organic compound layer formed in contact with the first organic compound layer and a cathode formed in contact with the second organic compound layer; a second light-emitting element having the first organic compound layer formed in contact with a second anode, a third organic compound layer formed in contact with the first organic compound layer and the cathode formed in contact with the third organic compound layer; and a third light-emitting element having the first organic compound layer formed in contact with a third anode, a fourth organic compound layer formed in contact with the first organic compound layer and the cathode formed in contact with the fourth organic compound layer; whereby the cathode is formed in a position overlapped with and in a same film as the first, second and third anodes.

Meanwhile, another structure is characterized by a light-emitting device having a plurality of light-emitting elements, the light emitting device comprising: a first light-emitting element having a first organic compound layer formed in contact with a first anode, a second organic compound layer formed in contact with the first organic compound layer and a cathode formed in contact with the second organic compound layer; a second light-emitting element having the first organic compound layer formed in contact with a second anode, a third organic compound layer formed in contact with the first organic compound layer and the cathode formed in contact with the third organic compound layer; and a third light-emitting element having the first organic compound layer formed in contact with a third anode, a fourth organic compound layer formed in contact with the first organic compound layer and the cathode formed in contact with the fourth organic compound layer; whereby the first light-emitting element, the second light-emitting element and the third light-emitting element exhibit different light-emission colors.

Incidentally, although explanation was herein made on the case of forming three kinds of light-emitting elements by using four kinds of polymer organic compounds, the invention is not limited to this but may form two kinds of light-emitting elements by using three kinds of polymer organic compounds. It is possible to form four or more kinds of light-emitting elements by using five or more kinds of polymer organic compounds.

As in the above, by carrying out patterning using a mask fixed by a sucker of a magnet or the like, it is possible to form, in the same pixel region, a plurality of light-emitting elements for exhibiting different light emissions.

BRIEF DESCRIPTION OF THE DRAWINGS

FIGS. 10A and 10B are views explaining an active-matrix light-emitting device;

DETAILED DESCRIPTION OF THE PREFERRED EMBODIMENT

Explanation will be made on the embodiment of the present invention.

Figure 1A:
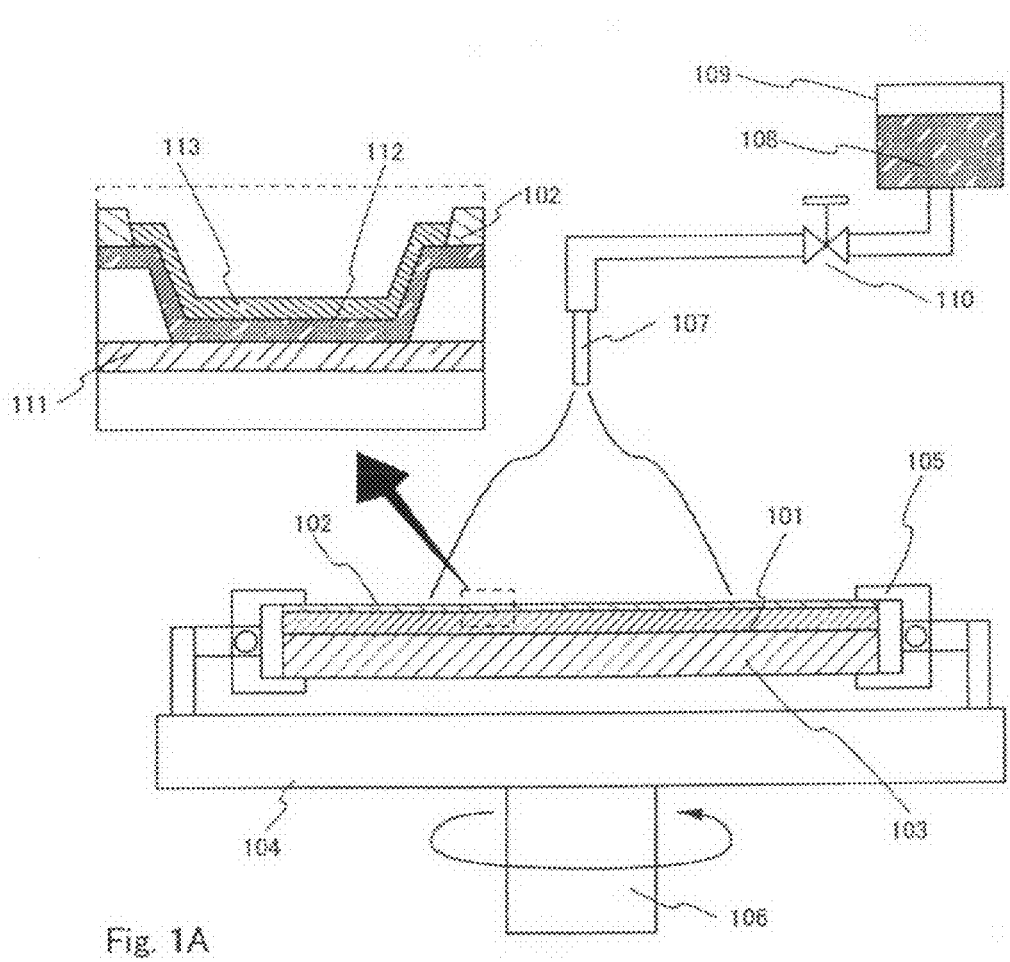
FIGS. 1A and 1B are views explaining a manufacturing method for a light-emitting device of the present invention.

FIG. 1A is a view simplifying the present invention in a simple form. In FIG. 1A, a metal mask 102 is arranged in a predetermined position over a surface of a substrate 101. In order to fix the metal mask 102, a magnet 103 is provided on a back surface of the substrate 101. The magnet 103 fixes the metal mask 102 through the substrate 101. In a state the metal mask is held and fixed, by applying an application liquid by a spin coat technique, it can be applied selectively onto a desired area.

The substrate shown herein has a TFT, an anode 111 electrically connected to the TFT and a first organic compound layer 112. The first organic compound layer 112 in this embodiment does not require especial, selective application because it can be used common to the pixels. Namely, in such a case, application is made by a spin coat technique without especially using a metal mask. The polymer organic compound for forming a first organic compound 112 uses PEDOT (poly(3,4-ethylene dioxythiophene)) having a great work function and a hole injecting nature, and polystyrene sulfonic acid (PSS) as an acceptor material. An application liquid dissolving them in water is applied by a spin coat technique. After application, the substrate is heated at 100° C. for 10 minutes to completely remove moisture, thereby forming a first organic compound layer 112. Note that moisture can be removed by baking the substrate in a vacuum.

Figure 1B:
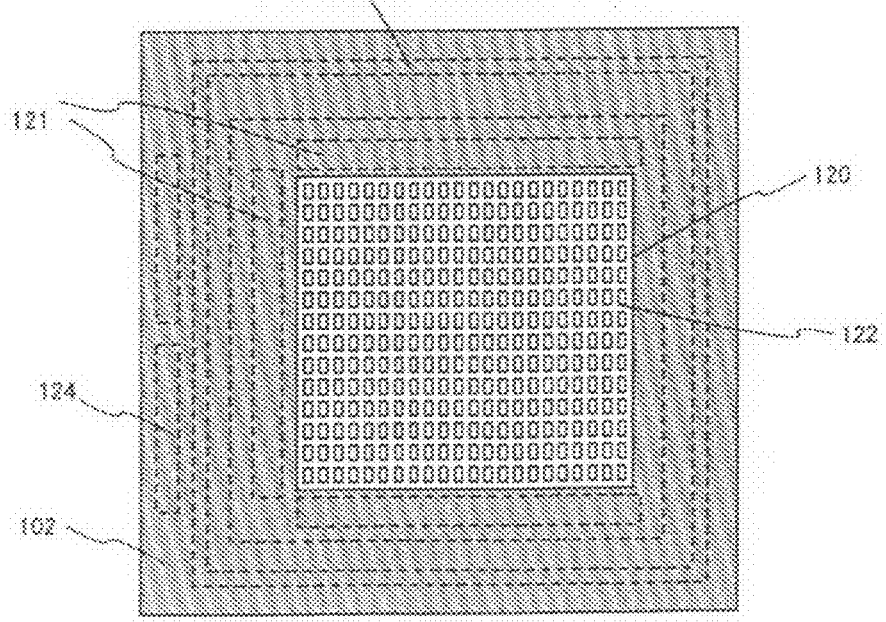
Figure 2A:
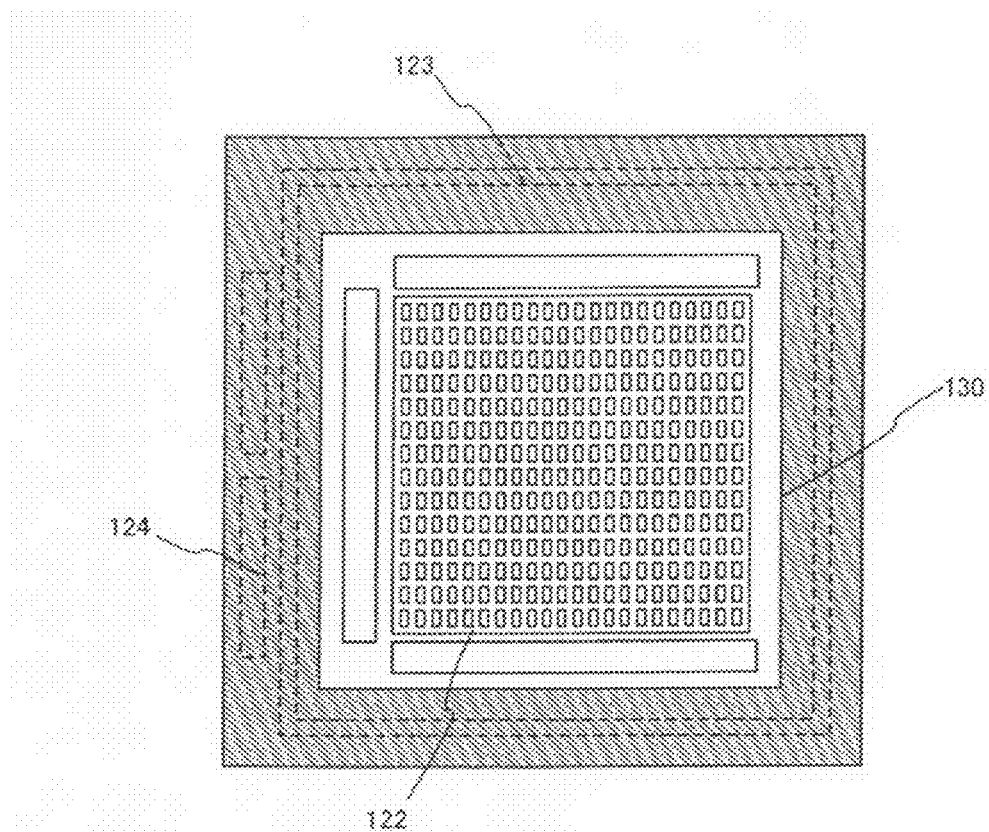
FIGS. 2A and 2B are views explaining a metal mask to be used in the invention.
Figure 2B:
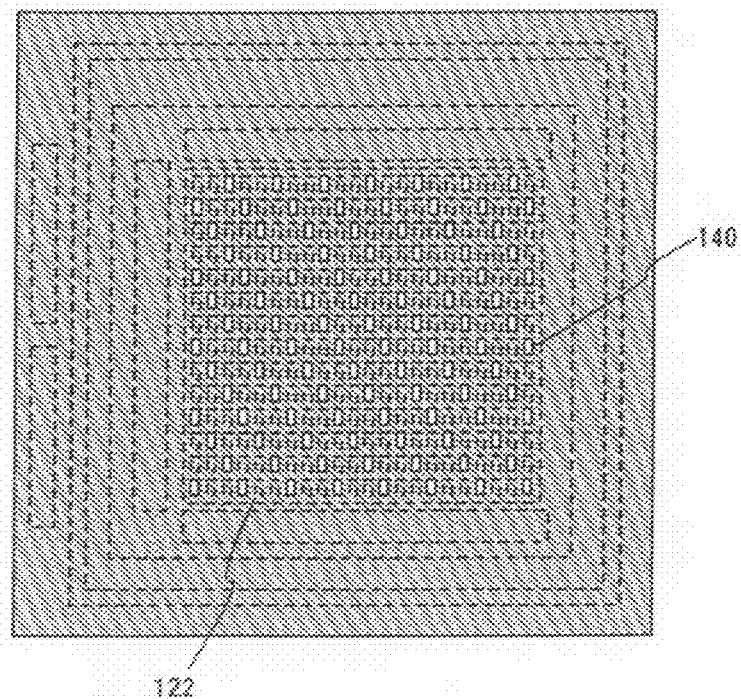

The metal mask 102 has an opening 120 formed only in a desired film-forming area over the substrate, as shown in FIG. 1B. Herein, the opening 120 is formed only in an area overlapped with a pixel region 122, of a drive circuit region 121 and pixel region 122 to be formed on the substrate. However, the invention is not limited to that but the opening 120 may be provided grater than that. For example, as shown in FIG. 2A, an opening 130 may be formed to such a degree as not to form a film on a sealant application position 123 and FPC bonding position 124. Furthermore, as shown in FIG. 2B, openings 140 may be formed to form a film on a part of the pixels to be formed in a matrix form within the pixel region 122.

The metal mask 102 may be structured to have an outer frame in order to facilitate positioning and increase strength.

Figure 3A:
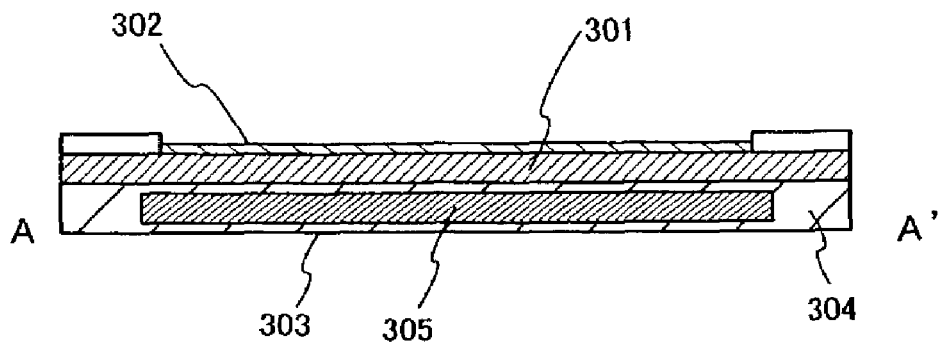
FIGS. 3A and 3B are views explaining a fixing plate to be used in the invention.
Figure 3B:
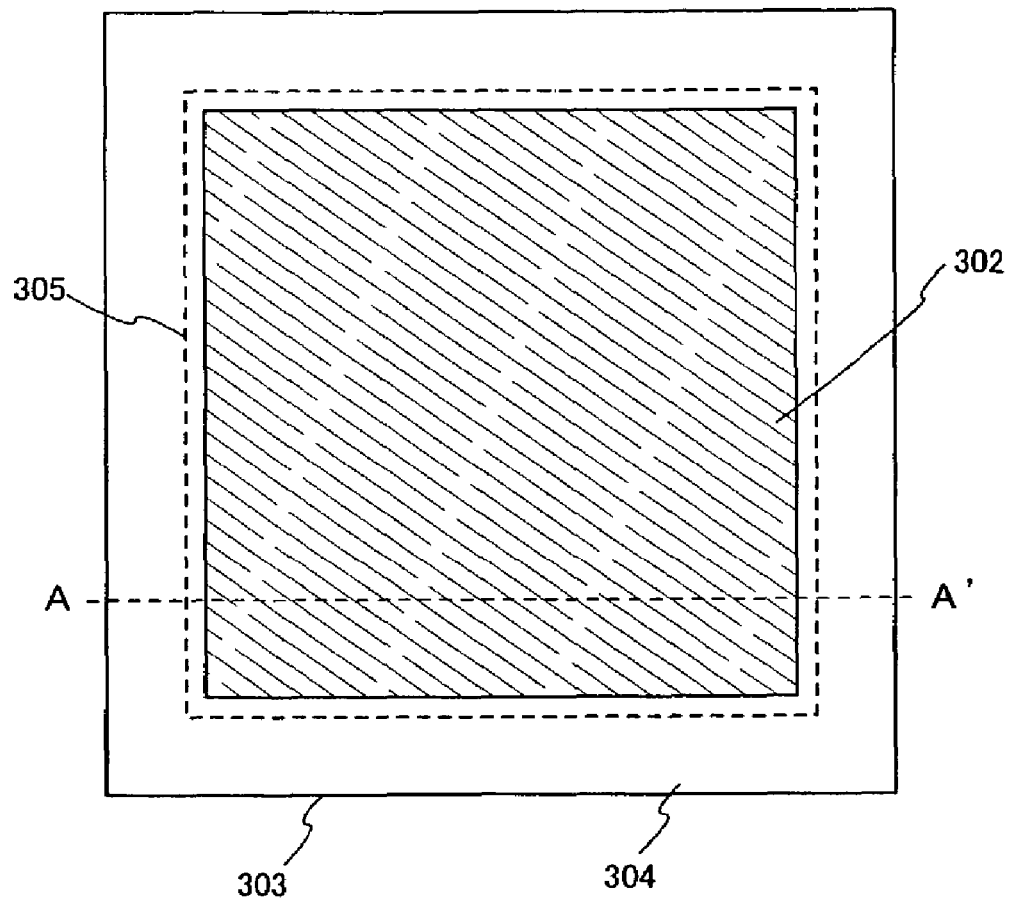

Explanation will now made on the magnet 103 to be used in the invention, using FIGS. 3A and 3B. The magnet 103, in this embodiment, is assumably structured provided on a fixing plate. The fixing plate 303 has a nonmagnetic metal or resin make frame 304 and a magnet (permanent magnet) 305 buried in the frame 304. The frame 304 is formed, for example, of stainless steel (SUS: Steel special Use Stainless) or a peak material. The form and size is nearly the same as the metal mask to fix and hold. The magnet 305, to be provided on the fixing plate 303, is provided through the substrate 301 in a position overlapping with the metal mask 302, as shown in FIG. 3A.

Incidentally, FIG. 3A is a sectional view showing a positional relationship between the substrate 301, the metal mask 302 and the magnet 305 provided on the frame structuring the fixing plate 303.

Meanwhile, FIG. 3B is a top view showing a positional relationship with the metal mask 302 arranged on the fixing plate 303 through the substrate 301. The section taken on line A-A' in FIG. 3B corresponds to FIG. 3A. Meanwhile, the magnet 305 is formed of a neodymium-iron-boron based magnet, an Sm—Co magnet, a ferrite magnet or the like.

Figure 4A:
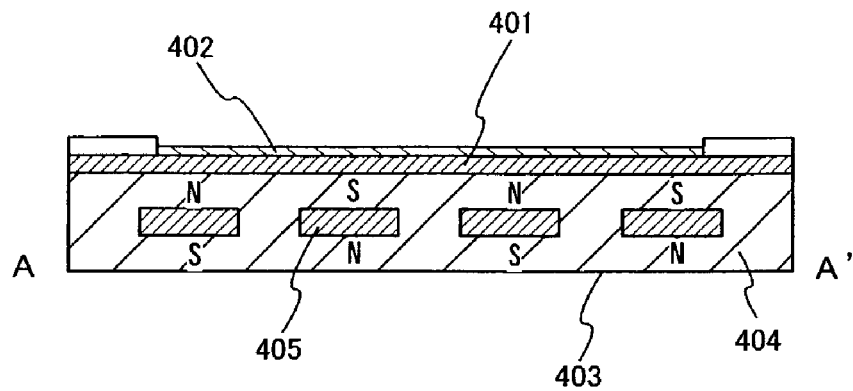
FIGS. 4A and 4B are views explaining a fixing plate to be used in the invention.
Figure 4B:
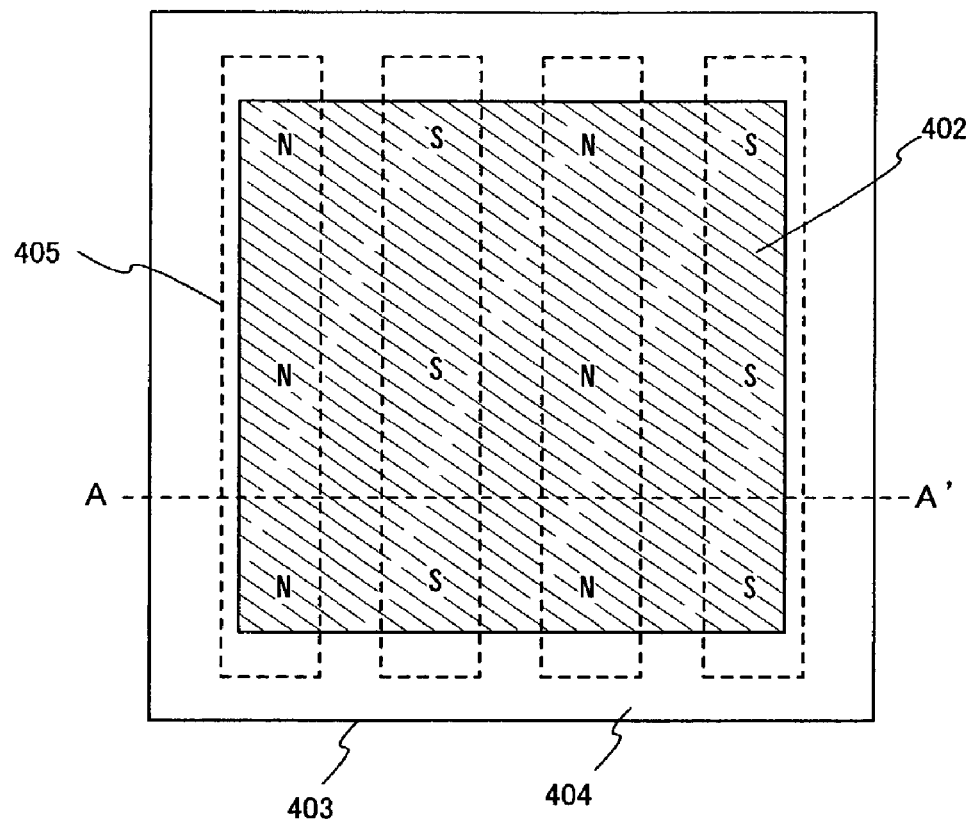

Note that the arrangement of the magnet 305 provided on the fixing plate 303 is not limited to the structure shown in FIGS. 3A and 3B but can be structured as shown in FIGS. 4A and 4B.

The fixing plate 403 of FIGS. 4A and 4B is made up with a frame 404 and a magnet 405. However, a plurality of magnets 405 are arranged on the frame 404 differently from the showing in FIGS. 3A and 3B. The magnet 405 is magnetized in a thickness direction of the magnet 405, as shown in FIG. 4A. The magnets are arranged buried alternately in the frame 404 such that adjacent magnets are opposite in magnetization direction. This arrangement allows many of the lines of magnetic force extending from each magnet to direct toward the magnet arranged parallel with the same magnet.

The magnets 405 are arranged buried in a stripe form such that the frame 404 at one side is in parallel with a lengthwise direction of the magnet. Namely, the fixing plate 403 sucks holding the metal mask in a stripe form.

FIG. 4A is a sectional view showing a positional relationship between the substrate 401, the metal mask 402, the fixing plate 403 and the magnets 405 provided in the fixing plate 403.

FIG. 4B is a top view showing a positional relationship with the metal mask 402 arranged on the fixing plate 403 through the substrate 401. The section taken on line A-A in FIG. 4B corresponds to FIG. 4A. Meanwhile, the magnet 405 is formed of neodymium-iron-boron based magnet, Sm—Co magnet, ferrite magnet or the like.

Figure 5A:
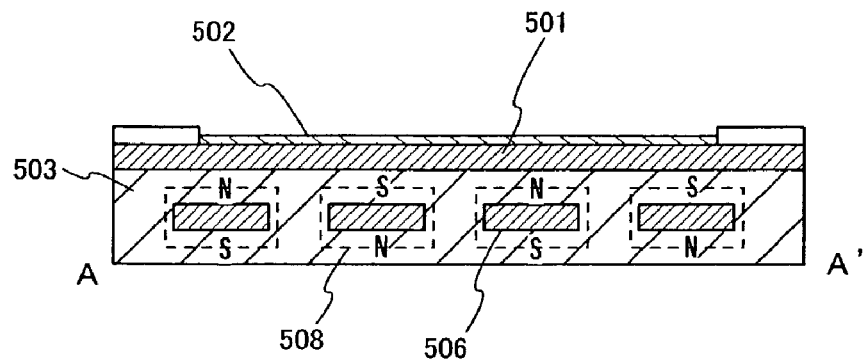
FIGS. 5A-5C are views explaining a fixing plate to be used in the invention.
Figure 5B:
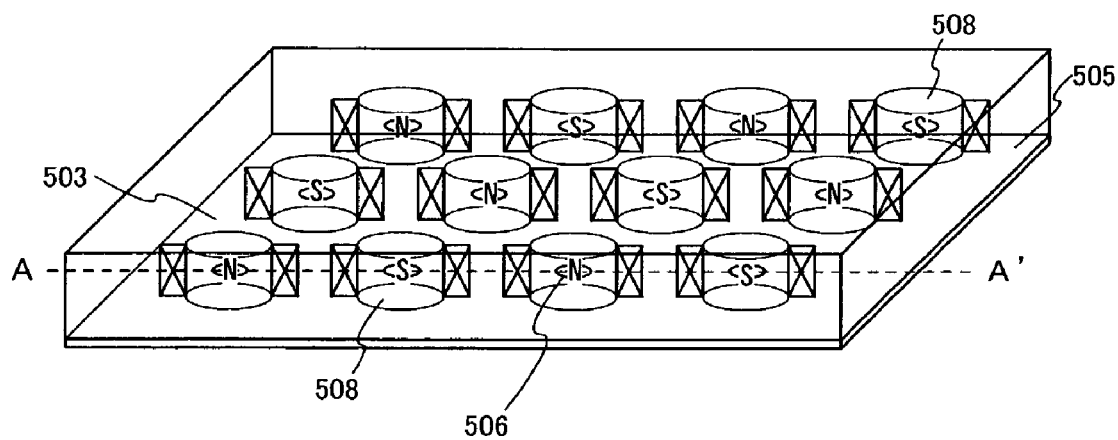

The arrangement of the magnet 405 provided on the fixing plate 403 is not limited to the structure shown in FIGS. 4A and 4B but can be structured as shown in FIGS. 5A and 5B.

In FIGS. 5A and 5B, a fixing plate 503 has a frame 505 and the magnets 506 and electromagnets 508 buried therein. Herein, the magnets 506 are arranged in a matrix form with a constant spacing, differently from those shown in FIGS. 3A and 3B, or 4A and 4B. The magnets 506 herein are arranged such that the S pole and the N pole alternately appear in the surface. Note that the arrangement of magnets shown herein is not limited to the provision of electromagnets 508 but can be used for the arrangement with only the magnets buried in the fixing plate.

Figure 5C:
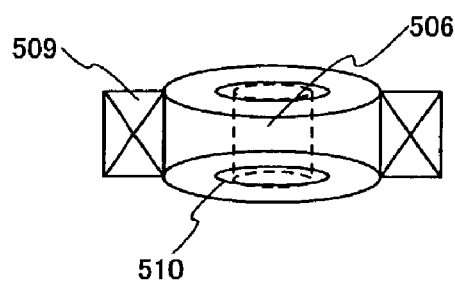

The electromagnet 508 has, as shown in FIG. 5C, a coil 509 having an inner diameter of 1.5-3 times a diameter of the magnet 506 and a cylindrical coil core 510 provided at the inside thereof. The coil core 510 is formed of a soft magnetic material.

Incidentally, arrangement is made such that the magnet 506 provided on the fixing plate 503 has an axis coincident with an axis of the coil core 510. Furthermore, each electromagnet 508 is provided, when energized, to cancel the magnetic field generated from the magnet 506.

Namely, when the metal mask 502 on the substrate 501 is held and fixed by using the fixing plate 503 as shown in FIGS. 5A and 5B, alignment is made between the substrate 501 and the metal mask 502 and thereafter the electromagnets 508 provided on the fixing plate 503 are energized to cancel the magnetic field of the magnets 506.

Then, the fixing plate 503 is moved toward the back surface of the substrate 501 and placed in a predetermined position. Then, the energization to the electromagnets 508 is ceased. Due to this, the metal mask 502 is held and fixed by the magnets 506. Incidentally, when removing the fixing plate from the substrate, similarly the electromagnets 508 are energized to cancel the magnetic field of the magnets 506 and thereafter the fixing plate 503 is detached from the substrate 501.

In this manner, the metal mask provided on the substrate is held and fixed as shown in FIGS. 3A to 5C.

Next, as shown in FIG. 1A, the substrate 101, the metal mask 102 and the fixing plate 103 are held by a fixing chuck 105 provided on a rotary table 104. The rotary table 104 has a rotary shaft 106. During forming a film, by rotating the rotary table 104 about the rotary shaft 106, the liquid applied over the substrate can be evenly formed into a film. The rotary shaft 106, directly coupled to a not-shown motor, is devised to rotate at a velocity as high as several thousand rpm during ejecting an application liquid.

Meanwhile, a nozzle 107 is provided in the above of the substrate 101. Application liquid 108 is ejected through the nozzle 107 and applied over the substrate 101. A tank 109 is provided to feed application liquid to the nozzle 107.

The application liquid is fed from the tank 109 to the nozzle 107. By a control valve 110, the amount of ejection onto the substrate 101 is controlled.

Herein, a second organic compound layer 113 is formed by applying an application liquid through the metal mask.

In this embodiment, the polymer organic compound for forming a second organic compound layer 113 can use polyparaphenylene vinylene derivative, polythiophene derivative, polyfluorene derivative, polyparaphenylene derivative, polyalkylphenylene or polyacetylene derivative, which is soluble in aprotic solvent.

Incidentally, the macropolymeric organic compound herein uses poly(2,5-dialkoxy-1,4- phenylene vinylene): RO-PPV. The application liquid, this is dissolved in toluene, is applied onto the first organic compound layer 112 by the spin coat technique explained before. Furthermore, this is heated at 80° C. for 3 minutes to remove toluene, thereby forming a second organic compound layer 113.

Then, a cathode (not shown) is formed on the second organic compound layer 113. Incidentally, the cathode herein is formed by an evaporation technique in a manner sandwiching, with an anode 111, the first organic compound layer 112 and second organic compound layer 113.

Incidentally, as a material for forming a cathode, it is possible to use, besides aluminum, an alloy of magnesium and silver (hereinafter, shown Mg:Ag), an alloy of magnesium and indium (hereinafter, shown Mg:In) or an alloy of magnesium and copper (hereinafter, shown Mg:Cu). Besides magnesium, it is possible to use an alloy using calcium, an alkali metal. Furthermore, can be used an alloy of aluminum and lithium (hereinafter, shown Al:Li) or the like.

By the above, a light emitting device can be formed having the anode 111, the first organic compound layer 112, the second organic compound layer 113 and cathode.

Incidentally, this embodiment explained a method of forming an organic compound layer for a light-emitting device formed with a first organic compound layer 112 and a second organic compound layer 113. However, in manufacturing a plurality of light-emitting elements, by changing and using the materials for forming a first organic compound layer 112 or second organic compound layer 113, it is possible to form a light-emitting device having a plurality of light-emitting elements for exhibiting different light emissions.

EMBODIMENTS

Embodiment 1

Explanation will be made on a method for manufacturing an active-matrix light-emitting device by carrying out the present invention, using FIGS. 6A-E and 7A-7C.

Figure 6A:
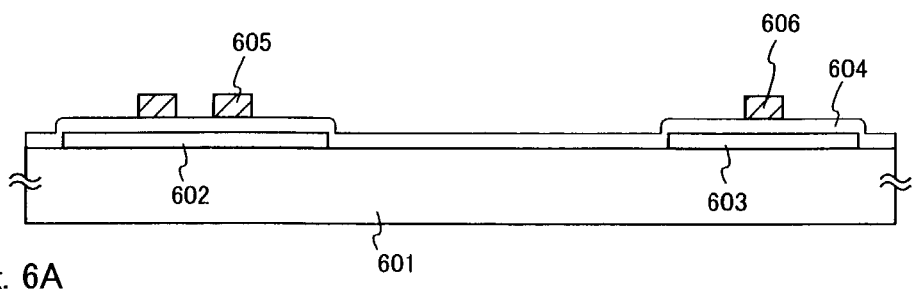
FIGS. 6A-6E are views explaining a manufacturing process for a light-emitting device of the present invention.

In FIG. 6A, a semiconductor device is formed on a substrate 601. Although in this embodiment the substrate 601 uses a glass substrate, a light transmissive substrate, such as a quartz substrate or a plastic substrate, may be used.

Also, explanation will be made herein on the case to manufacture a thin film transistor (TFT) as a semiconductor device.

First, a crystalline silicon film is formed to a film thickness of 50 nm. Known means can be used as a method to form a crystalline silicon film.

For example, a silicon film having an amorphous structure is formed by known means (sputter process, LPCVD process or plasma CVD process), and then subjected to a laser crystallization process, thermal crystallization process or thermal crystallization method using a catalyst of nickel or the like. The obtained crystalline silicon film is formed by patterning into a predetermined form.

In this embodiment, a plasma CVD process is employed to form an amorphous silicon film. Thereafter, a solution containing nickel is held over the amorphous silicon film. Dehydrogenation is made on the amorphous silicon film (500° C., 1 hour), followed by thermal crystallization (550° C., 4 hours). Furthermore, laser anneal process is carried out to improve the crystallinity, thereby forming a crystalline silicon film.

Meanwhile, prior to or after forming a crystalline silicon film, a slight amount of impurity element (boron or phosphorus) may be doped in order to control TFT threshold.

In the case of making a crystalline semiconductor film containing crystalline silicon film by a laser crystallization process, it is possible to use a pulse-oscillation or continuous-emission type gas or solid laser. The gas laser includes excimer laser, Ar laser, Kr laser and so on. The solid laser can use YAG laser, $YVO_4$ laser, YLF laser, $YAlO_3$ laser, glass laser, ruby laser, alexandrite laser, Ti:sapphire laser or the like.

In order to obtain a large-grained crystal during crystallizing the amorphous semiconductor film, a solid laser capable of continuously oscillating is preferably used to apply a second to fourth harmonic of a basic wave. Typically applied is a second harmonic (532 nm) or third harmonic (355 nm) of Nd:$YVO_4$ laser (basic wave: 1064 nm).

The laser light, emitted from a continuous wave $YVO_4$ laser having an output of 10 W, is converted into a higher harmonic by a non-linear optical element. Also, there is a method of placing a $YVO_4$ crystal and non-linear optical element in a resonator to emit a higher harmonic. Preferably, by an optical system is formed a rectangular or elliptic laser light on an irradiation surface, for irradiation onto a material to be treated. The energy density at this time requires approximately 0.01-100 $MW/cm^2$ (preferably 0.1-10 $MW/cm^2$). The semiconductor film is moved relative to the laser light at a velocity of approximately 10-2000 cm/s.

In the case of using such a laser for activation, the energy density is given approximately 0.01-100 $MW/cm^2$ (preferably 0.01-10 $MW/cm^2$). Furthermore, applied is the same condition of moving velocity as that of crystallization.

Then, the crystalline silicon film is patterned by a photolithography technique, to form an island-formed crystalline silicon film 602, 603 (hereinafter, referred to as an active layer). A gate insulating film 604 is formed by a silicon oxide film covering the active layer 602, 603. Furthermore, a gate electrode 605, 606 is formed on the gate insulating film 604. The material for forming a gate electrode 605, 606 uses a tungsten film or tungsten alloy film having a film thickness of 350 nm.

Figure 6B:
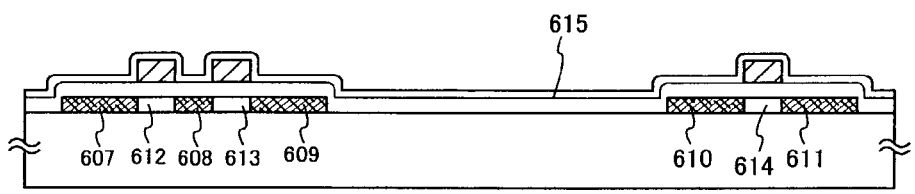

Then, the gate electrode 605, 606 is used as a mask to add an element belonging to periodic-table group 13 (typically, boron), as shown in FIG. 6B. The adding method uses known means. In this manner, formed is an impurity region 607-610 exhibiting p-conductivity type (hereinafter, referred to as a p-type impurity region). Meanwhile, a channel region 612-614 is defined beneath the gate electrode 605, 606. The p-type impurity region 607-611 is to be formed into a source or drain region of a TFT.

Next, a protection film (herein, a silicon oxinitride) 615 is formed to a thickness of 100 nm. Thereafter, a heating process is made to activate the element belonging to periodic-table group 13. The activation may be carried out by furnace anneal, laser anneal, lamp anneal or a combination thereof. This embodiment carries out a heating process in a nitrogen atmosphere at 550° C. for 4 hours.

After completing the activation, it is effective to carry out hydrogenation process. The hydrogenation process may use a known hydrogenation anneal technique or plasma hydrogenation technique.

Figure 6C:
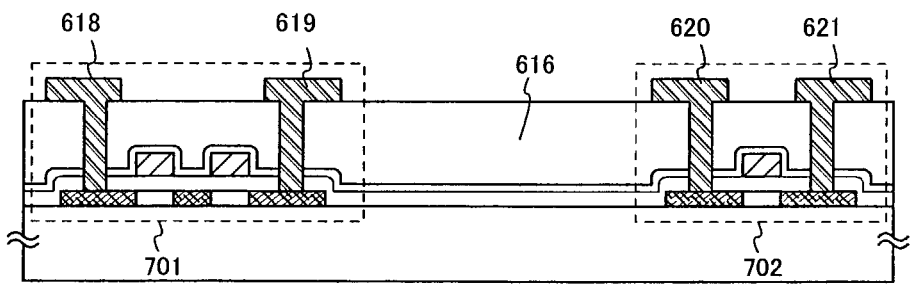
Figure 6D:
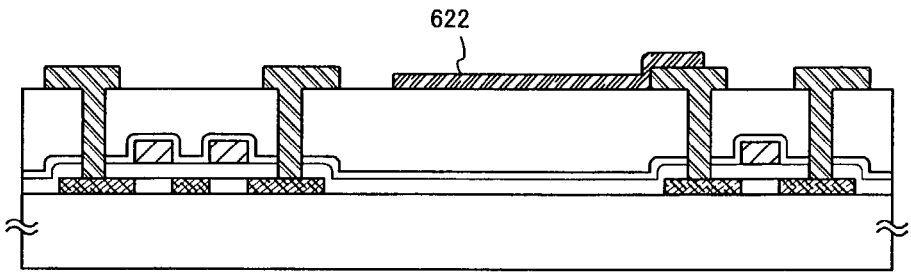

Next, as shown in FIG. 6C, a first interlayer insulating film 616 is formed. The first interlayer insulating film 616 may be formed by an inorganic insulating film, typically a silicon oxide film, a silicon oxynitride film, a silicon nitride film or a lamination film in combination thereof. This is formed by a plasma CVD technique under a reaction pressure of 20-200 Pa at a substrate temperature of 300-400° C. wherein discharge is caused at high frequency (13.56 MHz) with a power density of 0.1-1.0 W/cm$^2$. Otherwise, a plasma treatment may be made on a surface of the interlayer insulating film to form a hardened film containing one or a plurality of gas elements selected from hydrogen, nitrogen, carbon halide, hydrogen fluoride or inert gas. This embodiment forms a silicon oxynitride film with a film thickness of 1200 nm to provide a first interlayer insulating film 616.

Thereafter, a predetermined pattern of resist mask is formed to form a contact hole reaching the TFT drain region, forming an interconnection 618-621. The material of interconnection uses, as a conductive metal film, Al, Ti or an alloy material thereof to form a film by sputter or vacuum deposition process. Thereafter, this may be patterned into a predetermined form.

In this state, TFTs are completed. In this embodiment, in a pixel region of a light-emitting device, a switching TFT 701 and a current control TFT 702 are formed as shown in FIG. 6C. Simultaneously, formed is an erasing TFT 911 shown in FIG. 9. In this Embodiment 1, these TFTs are all formed as p-channel TFTs.

Then, formed is a light-transmissive conductive film, herein an ITO (indium thin oxide) film, to be formed into an anode 622 of a light-emitting element. The conductive film uses a material having a greater work function than a material for forming a cathode. Furthermore, it is possible to use a material having a lower sheet resistance than the ITO film, specifically platinum (Pt), chromium (Cr), tungsten (W) or nickel (Ni). The conductive film, in this case, preferably has a film thickness of 0.1-1 μm. Subsequently, the conductive film is patterned by etching to form an anode 622.

Thereafter, an organic resin film is formed of polyimide, acryl or polyimideamide over the entire surface. This can employ a thermo-set material to be cured by heating or a photosensitive material to be cured by radiating a ultraviolet ray. In the case of using a thermo-set material, a resist mask is thereafter formed to form an insulating film 623 having an opening above the anode 622 by dry etching. Where using a photosensitive material, a photomask is used to carry out an exposure and development process thereby forming an insulating film 123 having an opening above the anode 622. In any case, the insulating film 623 is formed in a manner covering an end of the anode 622 and having a tapered edge. By forming the edge in a taper form, it is possible to enhance the coverage of an organic compound layer to be formed later.

Note that the current-controlling TFT 702 formed before is electrically connected to the anode 622.

Then, an application liquid containing a polymer organic compound dissolved in an aprotic solvent is applied by a spin coat technique. Herein, the polymer organic compound uses PEDOT and PSS, to use an application liquid having them dissolved in water. Meanwhile, prior to applying the application liquid, the substrate on which a film is to be formed is preferably cleaned with ozone water or the like. In applying PEDOT and PSS, used is a metal mask formed covering an area excepting a pixel and drive circuit region as shown in FIG. 2A.

Furthermore, a ultraviolet ray is radiated onto the substrate in an oxygen atmosphere for 10 minutes, thereby carrying out a process to make a substrate surface hydrophilic.

Figure 6E:
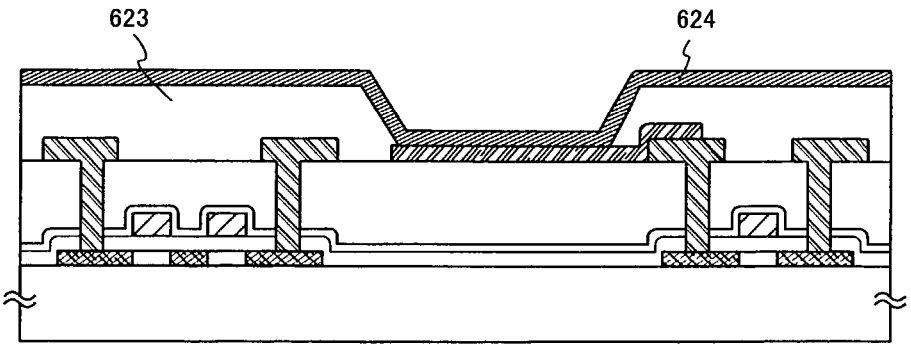

Incidentally, the spin rotation velocity upon spin application is at 1500 rpm, to carry out a process for 30 seconds. This can form a first organic compound layer 624 in a film thickness of 20-80 nm (FIG. 6E). After film forming, a heating process is made at 100° C. for 5-15 minutes, to remove moisture.

Figure 7A:
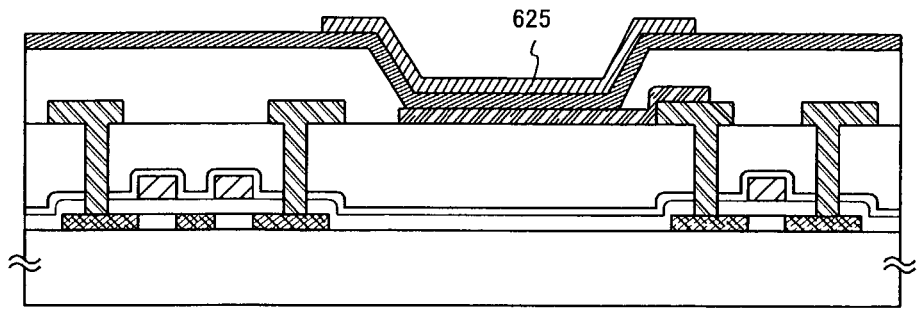
FIGS. 7A-7C are views explaining a manufacturing process for a light-emitting device of the present invention.

Next, as shown in FIG. 7A, formed is a second organic compound layer 625 to be made into a light-emitting layer of a light-emitting element. This embodiment applies, by spin coat technique, an application liquid having poly(2-(dialkoxyphenyl)-1,4-phenylene vinylene): ROPh-PPV for exhibiting green light emission dissolved in an aprotic solvent, toluene, over a substrate having a metal mask. After forming a film, a thermal process is made at 80° C. for 3 minutes to vaporize toluene thereby obtaining a 80-nm film thickness.

It is noted that FIG. 7 shows only one light-emitting element. However, according to a film forming method using a metal mask of the invention, it is possible to form a plurality of light-emitting elements having different light-emitting layers as shown in FIG. 8.

Figure 8:
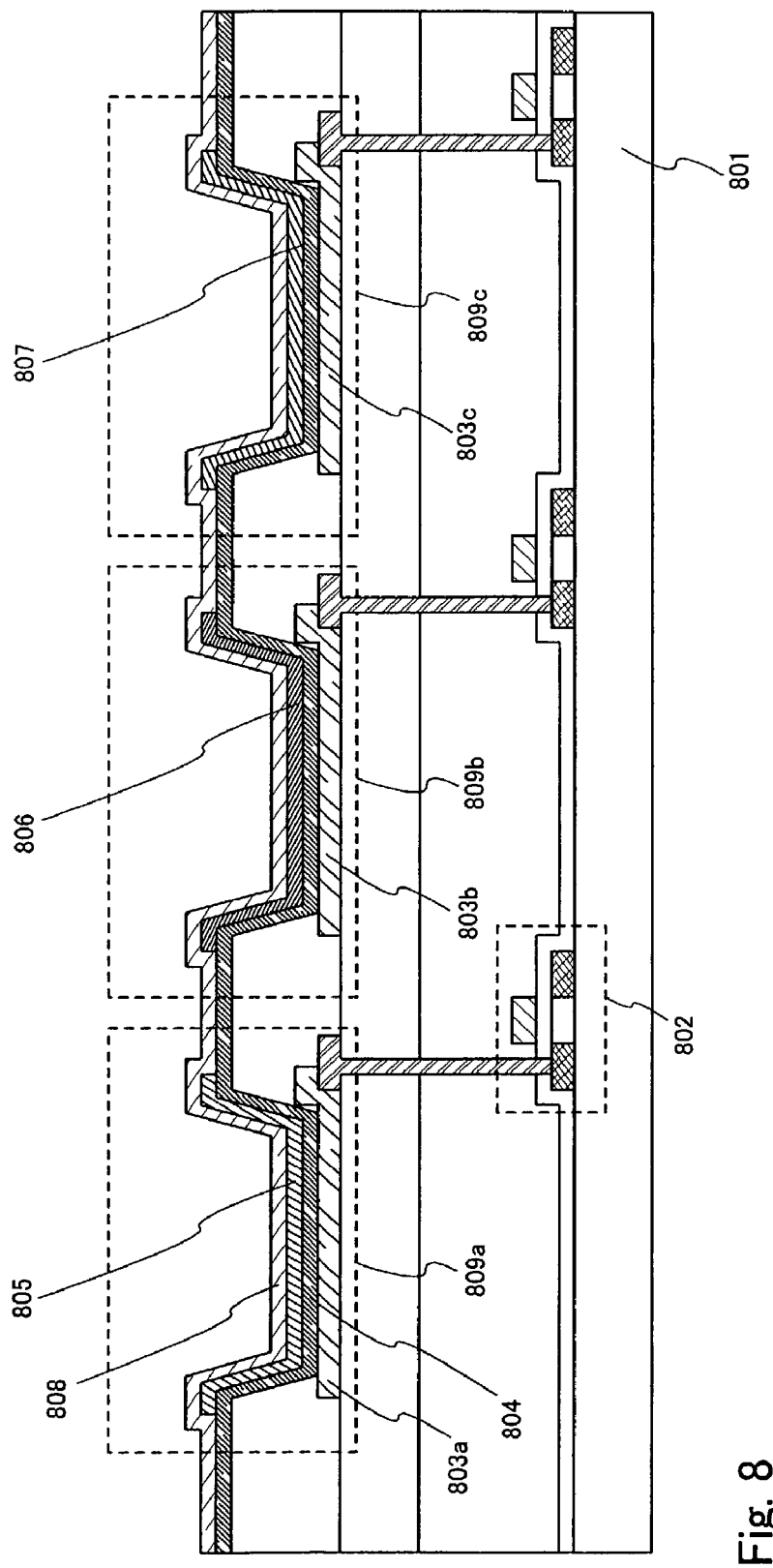
FIG. 8 is a view explaining a structure of a light-emitting element.

In FIG. 8, a first organic compound 804 is formed on an anode 803 (803a, 803b, 803c) electrically connected to a current-controlling TFT 802 formed over the substrate 801. The second organic compound layer 805 formed on the anode 803a is formed of ROPh-PPV to exhibit green light emission as shown before.

Meanwhile, the material for use in a third organic compound layer 806 to be formed on the anode 803b uses an application liquid having poly(9,9-dialkylfluone): PDAF for exhibiting blue light emission dissolved in toluene being applied onto a substrate having a metal mask by a spin coat technique. After forming a film, a thermal process is made at 80° C. for 3 minutes to vaporize toluene, thereby obtaining an 80-nm film thickness.

Furthermore, the material for use in a fourth organic compound layer 807 to be formed on the anode 803c uses an application liquid having poly(2,5-dialkoxy-1,4-phenylene vinylene): RO-PPV exhibiting red light emission dissolved in toluene by being applied onto a substrate having a metal mask by a spin coat technique. After forming a film, a thermal process is made at 80° C. for 3 minutes to vaporize toluene, thereby obtaining an 80-nm film thickness.

By the above, a plurality of organic compound layers can be formed on the anode by the use of the metal mask.

Figure 7B:
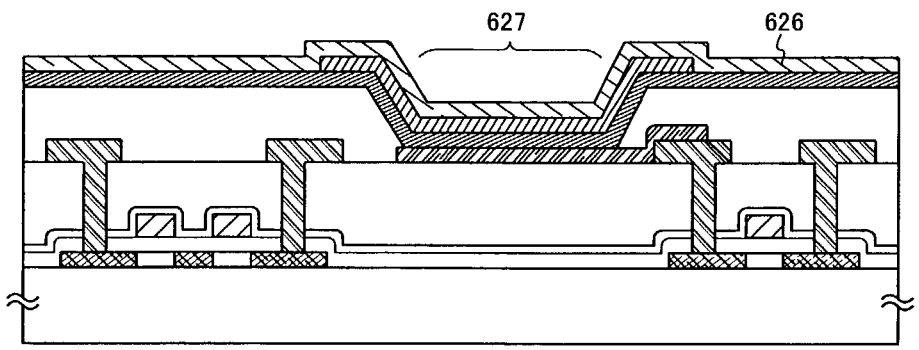

Next, a cathode for a light-emitting element is formed on the organic compound layer. As shown in FIG. 7B, a cathode 626 is formed on the second organic compound layer 625 by an evaporation process. The material for the cathode 626 uses an Mg:Ag alloy formed in a film thickness of 100-120 nm. As for the material for forming a cathode 626, besides the Mg:Ag alloy it is possible to use a film formed by a co-evaporation process with an element belonging to periodic-table 1 or 2 group and aluminum.

By the above, a light-emitting element 627 can be formed which has organic compound layers between the anode and the cathode on the same substrate, as shown in FIG. 7B. Incidentally, by practicing the present embodiment, it is possible to selectively form a first light-emitting element 809a having a first organic compound layer 804 and second organic compound layer 805 between the anode 803a and the cathode 808, a second light-emitting element 809b having a first organic compound layer 804 and third organic compound layer 806 between the anode 803b and the cathode 808 and a third light-emitting element 809c having a first organic compound layer 804 and fourth organic compound layer 807 between the anode 803c and the cathode 808, as shown in FIG. 8.

Figure 7C:
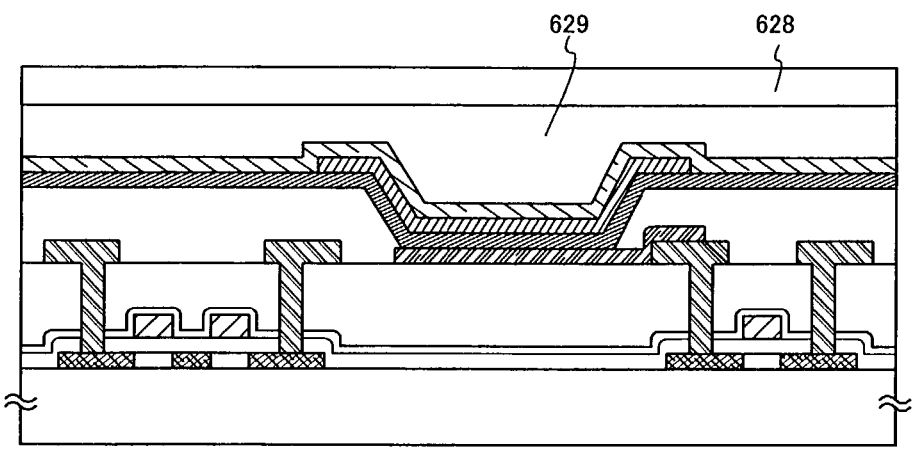

Furthermore, as shown in FIG. 7C, the light emitting element 627 is sealed with a cover material 628 or the like to enclose it in a space 629. This can completely shield the light-emitting element 627 from the outside, thereby preventing a substance to cause deterioration in the organic compound layer, e.g. moisture or oxygen, from intruding from the outside.

Incidentally, the material for structuring a cover member 628 can use, besides a glass substrate or a quartz substrate, a plastic substrate formed of FRP (Fiberglass-Reinforced Plastics), PVF (PolyVinyl Fluoride), Mylar, polyester, acryl or the like.

Embodiment 2

Embodiment 1 shows an embodiment of choosing a luminous polymeric organic compound that is soluble in an aprotic solvent from polymeric organic compounds that can be used to form organic compound layers. However, the present invention can employ a polymeric organic compound that has little or no solubility to an aprotic solvent if it can be dispersed in the aprotic solvent. It is also possible to mix an organic compound that does not emit light but has other functions in an organic compound layer. Organic compounds that can be used in the present invention are listed below.

Functions that the organic compounds in the present invention have other than light emission can be hole transportation function and electron transportation function. These materials are not necessarily polymeric organic compounds but may be low molecular weight organic compounds.

Embodiments of those compounds which are known as the material having the hole transportation, and which are aromatic amine-based, include N,N'-bis(3-methylphenyl)-N,N'-diphenyl-[1,1'-biphenyl]-4,4'-diamine (TPD); 4,4'-bis[N-(1-naphthyl)-N-phenylamino]-biphenyl (hereafter referred to as -NPD); and starburst type aromatic amine compounds. As the starburst type aromatic amine compounds, 4,4',4"-tris(N,N-diphenylamino)-triphenylamine (hereinafter referred to as, TDATA); and 4,4',4"-tris[N-(3-methylphenyl)-N-phenylamino]-triphenylamine (hereafter referred to as MTDATA) can be used.

The materials having electron transportation include: metal complexes having quinoline skeleton or benzoquinoline skeleton, such as tris(8-quinolinolate)aluminum (hereinafter referred to as $Alq_3$), tris(4-methyl-8-quinolinolate)aluminum (hereinafter referred to as $Almq_3$"), and bis(10-hydroxybenzo[h]-quinolinate)beryllium (hereinafter referred to as $Bebq_2$), which are metal complexes; and bis(2-methyl-8-quinolinolate)-(4-hydroxy-biphenylyl)aluminum (hereinafter referred to as BAlq), which are mixed ligand complexes. Those materials also include metal complexes having an oxazole-based or thiazole-based ligand such as bis[2-(2-hydroxypheyl)-benzoxazolate]zinc (hereinafter referred to as Zn $(BOX)_2$) and bis[2-(2-hydroxypheyl)-benzothiazolate]zinc (hereinafter referred to as Zn$(BTZ)_2$). Furthermore, other those materials include, in addition to above-mentioned metal complexes, oxadiazole derivatives such as 2-(4-biphenylyl)-5-(4-tert-butylphenyl)-1,3,4-oxadiazole (hereinafter referred to as PBD) and 1,3-bis[5-(p-tert-butylphenyl)-1,3,4-oxadiazole-2-yl]benzene (hereinafter referred to as OXD-7"); triazole derivatives such as 3-(4-tert-butylphenyl)-4-phenyl-5-(4-biphenylyl)1,2,4-triazole (hereinafter referred to as TAW) and 3-(4-tert-butylphenyl)-4-(4-ethylpheyl)-5-(4-biphenylyl)-1,2,4-triazole (hereinafter referred to as p-EtTAZ); and phenanthroline derivatives such as bathophenanthroline (hereinafter referred to as BPhen) and bathocuproine (hereinafter referred to as BCP).

Also, fluorescent dyes and triplet light-emitting materials may be used as the organic compound. Embodiments of the flourescent dyes include 4-(dicyanomethylene)-2-methyl-6-(p-dimethylaminostyryl)-4H-pyran (DCM), coumarin-540, rubrene, rhodamine 6G, perylene, quinacridone, pyrazoline, which are styryl dyes, and the like. Furthermore, tris(2-phenylpyridine)iridium (hereinafter referred to as Ir$(ppy)_3$) and 2,3,7,8,12,13,17,18-octaethyl-21H, 23H-porphyrin-platinum (hereafter referred to as PtOEP), and the like are known as the triplet light-emitting material.

Further, when the triplet light-emitting materials are used, it is preferable to mix the above mentioned BAlq, OXD-7, TAZ, P-EtTAZ, Bphen, BCP, or the like thereto as a blocking material.

Further, it is also possible to use the high-molecule weight organic compounds mentioned below.

Namely, materials such as poly(1,4-phenylenevinylene), poly(1,4-naphthalenevinylene), poly(2-phenyl-1,4-phenylenevinylene), polythiophene, poly(3-phenylthiophene), poly (1,4-phenylene), poly(2,7-fluorene), or the like can be used as the organic compound.

By using in combination the above materials having different functions, an organic light-emitting element that is lower in drive voltage and longer in lifetime than prior art can be obtained. The structure of this embodiment may be combined freely with the structure of Embodiment 1.

Embodiment 3

Figure 9A:
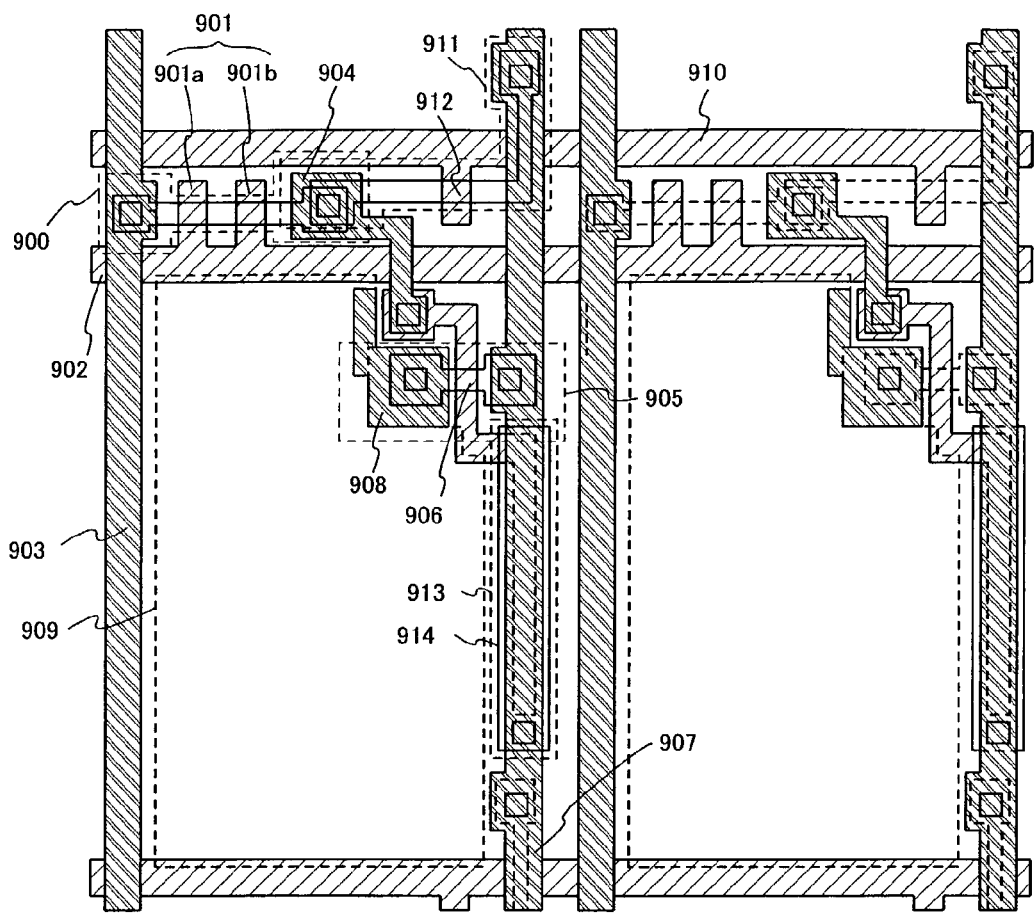
FIG. 9A is a top view of a pixel region of the light-emitting device.
Figure 9B:
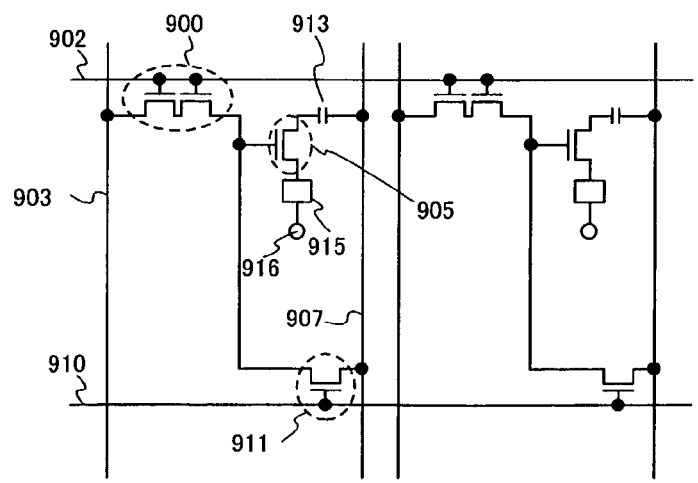
FIG. 9B is a circuit diagram of a pixel region of the light emitting device.

A detailed top surface structure of a pixel portion formed by using the present invention and explained in Embodiment 1 is shown in FIG. 9A, and a circuit diagram thereof is shown in FIG. 9B. FIGS. 9A and 9B are denoted by a same reference numerals.

In FIGS. 9A and 9B, a switching TFT 900 provided on a substrate is formed by using the switching TFT (n-channel type) TFT 702 of FIG. 6C. Therefore, an explanation of the switching (n-channel type) TFT 702 may be referred for an explanation of the structure. Further, a wiring indicated by reference numeral 902 is a gate wiring for electrically connecting with gate electrodes 901 (901a and 901b) of the switching TFT 900.

Note that, in this embodiment, a double gate structure is adopted, in which two channel forming regions are formed, but a single gate structure, in which one channel forming region is formed, or a triple gate structure, in which three channel forming regions are formed, may also be adopted.

Further, a source of the switching TFT 900 is connected to a source wiring 903, and a drain thereof is connected to a drain wiring 904. The drain wiring 904 is electrically connected with a gate electrode 906 of a current control TFT 905. Note that the current control TFT 905 is formed by using the current control (n-channel type) TFT 702 of FIG. 6C. Therefore, an explanation of the current control (n-channel type) TFT 702 may be referred for an explanation of the structure. Note that, although the single gate structure is adopted in this embodiment, the double gate structure or the triple gate structure may also be adopted Further, a source of the current control TFT 905 is electrically connected with a current supply line 907, and a drain thereof is electrically connected with a drain wiring 908. Besides, the drain wiring 908 is electrically connected with a cathode 909 indicated by a dotted line.

A wiring indicated by reference numeral 910 is a gate wiring connected with the gate electrode 912 of the erasing TFT 911. Further, a source of the erasing TFT 911 is electrically connected to the current supply line 907, and a drain thereof is electrically connected to the drain wiring 904.

The erasing TFT 911 is formed like a current controlling TFT (n-channel type) 702 in FIG. 6C. Therefore, an explanation of the structure is referred to that of the current controlling TFT (n-channel type) 702. In this embodiment, a single gate structure is described though, a double gate structure or a triple gate structure can be used.

At this time, a storage capacitor (condenser) is formed in a region indicated by reference numeral 913. The condenser 913 is formed among a semiconductor film 914 electrically connected with the current supply line 907, an insulating film (not shown) of the same layer as a gate insulating film, and the gate electrode 906. Further, a capacitor formed by the gate electrode 906, the same layer (not shown) as a first interlayer insulating film, and the current supply line 907 may be used as a storage capacitor.

The light-emitting element 915 shown in circuit diagram in FIG. 9B is composed of the cathode 909, an organic compound layer (not illustrated) formed on the cathode 909, and an anode (not illustrated) formed on the organic compound layer. In the present invention, the cathode 909 is connected with a source region and a drain region of the current controlling TFT 905.

A counter potential is supplied to the anode of the light-emitting element 915. In addition, the power source potential is supplied to the power supply line 907. A potential difference between the counter potential and the power source potential is always maintained at such a level that causes the light-emitting element to emit light when the power source potential is applied to the pixel electrode. The power source potential and the counter potential are supplied to the light-emitting device of the present invention by means of a power source provided by an externally-attached IC chip or the like. In the present specification, the power source supplying a counter potential is referred to as the counter power source 916.

The structure of the present embodiment may be freely combined with the structure of embodiment 1 or 2.

Embodiment 4

Referring to FIGS. 10A and 10B, the external appearance of a light-emitting device of the present invention will be described in the present embodiment. FIG. 10A is a top view of the luminescent device, and FIG. 10B is a sectional view taken on line A-A' of FIG. 10A. Shown by dotted lines, reference numeral 1001 represents a source signal line driving circuit, 1002, a pixel portion; and 1003, a gate signal line driving circuit; 1004, a cover member; and 1005, a sealing agent. A space is surrounded by the sealing agent 1005.

Reference number 1008 represents an interconnection for transmitting signals inputted to the source signal line driving circuit 1001 and the gate signal line driving circuit 1003. The interconnection 1008 receives video signals or clock signals from a flexible print circuit (FPC) 1009, which will be an external input terminal. Only the FPC is illustrated, but a printed wiring board (PWB) may be attached to this FPC. The light-emitting device referred to in the present specification may be the body of the light-emitting device, or a product wherein an FPC or a PWB is attached to the body.

The following will describe a sectional structure, referring to FIG. 10B. The driving circuits and the pixel section are formed on the substrate 1010, but the source signal line driving circuit 1001 as one of the driving circuits and the pixel section 1002 are shown in FIG. 10B.

In the source signal line driving circuit 1001, a CMOS circuit wherein an n-channel type TFT 1013 and a p-channel type TFT 1014 are combined is formed. The TFTs constituting the driving circuit may be composed of known CMOS circuits, PMOS circuits or NMOS circuits. In the present embodiment, a driver-integrated type, wherein the driving circuit is formed on the substrate, is illustrated, but the driver-integrated type may not necessarily be adopted. The driver may be fitted not to the substrate but to the outside.

The pixel portion 1002 is composed of a plurality of pixels each of which includes a current controlling TFT 1011 and an anode 1012. The anode 1012 is electrically connected to a drain of the current controlling TFT 1011.

An insulating layer 1015 is formed on each end of the anode 1012. An organic compound layer composed of a first organic compound layer 1016 and a second organic compound layer 1017 is formed on the anode 1012. A cathode 1018 is formed on the second organic compound layer 1017. Thus completed is a light-emitting element 1019 composed of the anode, the organic compound layer, and the cathode.

The cathode 1018 also functions as a common wiring line shared by all the pixels and is electrically connected to the FPC 1009 through the connection wiring line 1008.

The cover member 1004 is bonded to the substrate 1010 with the sealing agent 1005 in order to seal the light-emitting element 1019 formed over the substrate 1010. Spacers formed from a resin film may be provided to keep the distance between the cover member 1004 and the light-emitting element 1019. The space 1007 inside the sealing agent 1005 is filled with inert gas such as nitrogen. The sealing agent 1005 is preferably an epoxy resin. Desirably, the material of the sealing agent 1005 is one that allows as little moisture and oxygen as possible to transmit. A hygroscopic substance or an anti-oxidizing substance may be placed in the space 1007.

In this embodiment, a glass substrate or a quartz substrate is used as the cover member 1004. Alternatively, the cover member may be a plastic substrate that is formed of FRP (fiberglass-reinforced plastics), PVF (polyvinyl fluoride), Mylar, polyester, acrylic, or the like. After the cover member 1004 is bonded to the substrate 1010 using the sealing agent 1005, the side faces (exposed faces) of the device may be further covered and sealed by the sealing agent.

By sealing the light-emitting element in the space 1007 as described above, the light-emitting element is completely shut off from the outside and external substances that accelerate degradation of the organic compound layer, such as moisture and oxygen, can be prevented from entering the light-emitting element. Therefore, a highly reliable light-emitting device can be obtained.

The structure of this embodiment may be freely combined with any of the structures of Embodiments 1 through 3.

Embodiment 5

Figure 11:
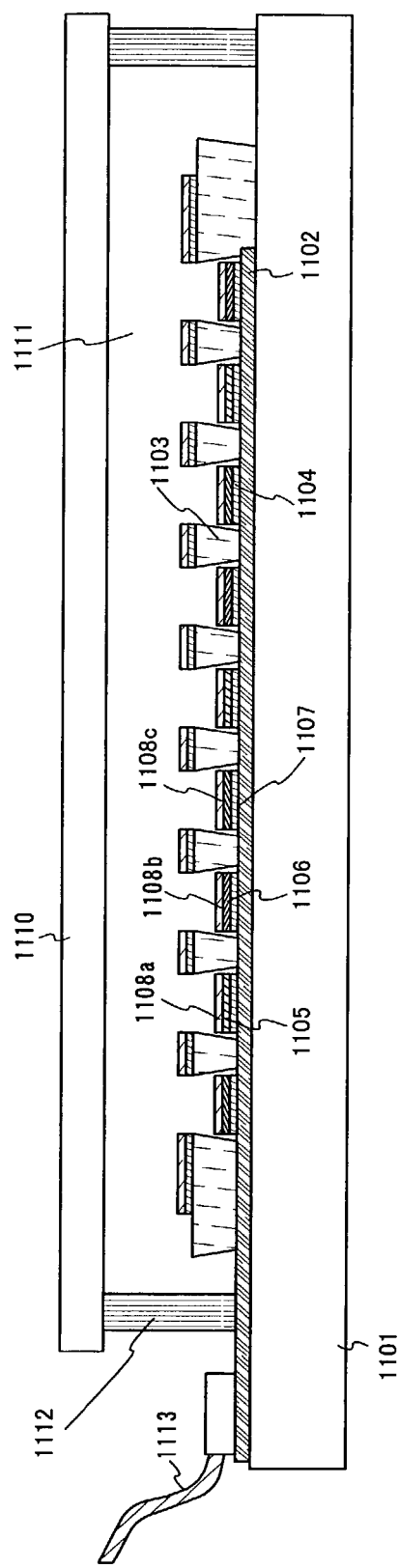
FIG. 11 is a view explaining a passive-matrix light-emitting device.

This embodiment describes a case of manufacturing a passive (simple matrix) light-emitting device in accordance with a manufacturing method of the present invention. The description is given with reference to FIG. 11. In FIG. 11, reference numeral 1101 denotes a glass substrate and 1102 denotes anodes formed from a transparent conductive film. In this embodiment, the transparent conductive film is formed by evaporation from a compound of indium oxide and zinc oxide. Though not shown in FIG. 11, a plurality of anodes 1102 are arranged to form a stripe pattern in the direction horizontal to the surface of the drawing paper.

Banks 1103 are formed to intersect the anodes 1102 arranged to form a stripe pattern. The banks 1103 are in contact with the anodes 1102 and are perpendicular to the surface of the drawing paper.

Next, an organic compound layer having a laminate structure is formed. In this embodiment, as a first organic compound layer 1104, first, PEDOT is dissolved in water and the obtained solution is applied by spin coating by using a metal mask. The applied solution is heated at 100° C. for 5 to 15 minutes in the atmosphere or in vacuum to remove water, thereby obtaining the first organic compound layer with a thickness of 30 to 50 nm only in the pixel portion 1104 only.

Next, a second organic compound layer 1105 (not shown) is formed to have a thickness of 50 to 150 nm. For the method of the formation of the second organic compound layer 1105 is as below: poly(2-(dialkoxyphenyl)-1,4-phenylene vinylene) (denoted by ROPh-PPV) is dissolved in toluene and the obtained solution is applied by spin coating by using a metal mask and then heated at 80° C. for 3 minutes to vaporize the solvent.

Next, a third organic compound layer 1106 is formed to have thickness of 50 to 150 nm. For the method of the formation of the third organic compound layer 1106 is as below: poly(9,9'-dialkyl fluorene) (denoted by PDAF) is dissolved in toluene and the obtained solution is applied by spin coating by using a metal mask and then heated at 80° C. for 3 minutes to vaporize the solvent.

Next, a fourth organic compound layer 1107 is formed to have thickness of 50 to 150 nm. For the method of the formation of the fourth organic compound layer 1107 is as below: poly(2,5-dialkoxy-1,4-phenylene) (denoted by ROPh-PPV) is dissolved in toluene and the obtained solution is applied by spin coating by using a metal mask and then heated at 80° C. for 3 minutes to vaporize the solvent.

A cathode electrode 1108 is formed next. Incidentally, in this embodiment, the material with a thickness 100 to 120 nm of the cathode electrode 1108 is formed by evaporation from a compound of Mg:Ag alloy. Besides the Mg:Ag alloy, the material also can be a film comprised of an element belongs to the first elementary family or the second elementary family in the periodic table, and formed with aluminum by evaporation.

Through the above steps, light-emitting elements each having a plurality of organic compound layers are obtained. In this embodiment, a laminate of the first organic compound layer and the second organic compound layer, a laminate of the first organic compound layer and the third organic compound layer, and a laminate of the first organic compound layer and the fourth organic compound layer are equally referred to as organic compound layer. These organic compound layers are formed along the groove between the banks 1103 and therefore are arranged to form a stripe pattern in the direction perpendicular to the top face of the drawing paper.

A connection wiring line 1109 for electrically connecting the first cathode 1108a, the second cathode 1108b, and the third cathode 1108c are formed by evaporation. The material of the connection wiring line is Al in this embodiment.

The light-emitting elements are formed on the substrate 1101 through the above steps. In this embodiment, the lower electrode is an anode transmissive of light and therefore light emitted from the organic compound layers travels downward (toward the substrate 1101).

Next, a ceramic substrate is prepared as a cover member 1110. The ceramic substrate is chosen because the structure of this embodiment does not need a light-transmissive cover member. However, a plastic substrate or a glass substrate may be used as the cover member 1110.

The cover member 1110 is bonded to the substrate 1101 using a sealing agent 1112 that is a UV-curable resin. Inside the sealing agent 1112 is a sealed space 1111, which is filled with inert gas such as nitrogen or argon. It is effective to place a hygroscopic material, typically, barium oxide, in the sealed space 1111. Lastly, an anisotropic conductive film (FPC) 1113 is attached to the substrate to complete a passive light-emitting device. The organic compound layers of this embodiment can be formed using any combination of the materials given in Embodiment 1 or 2.

Embodiment 6

Figure 12:
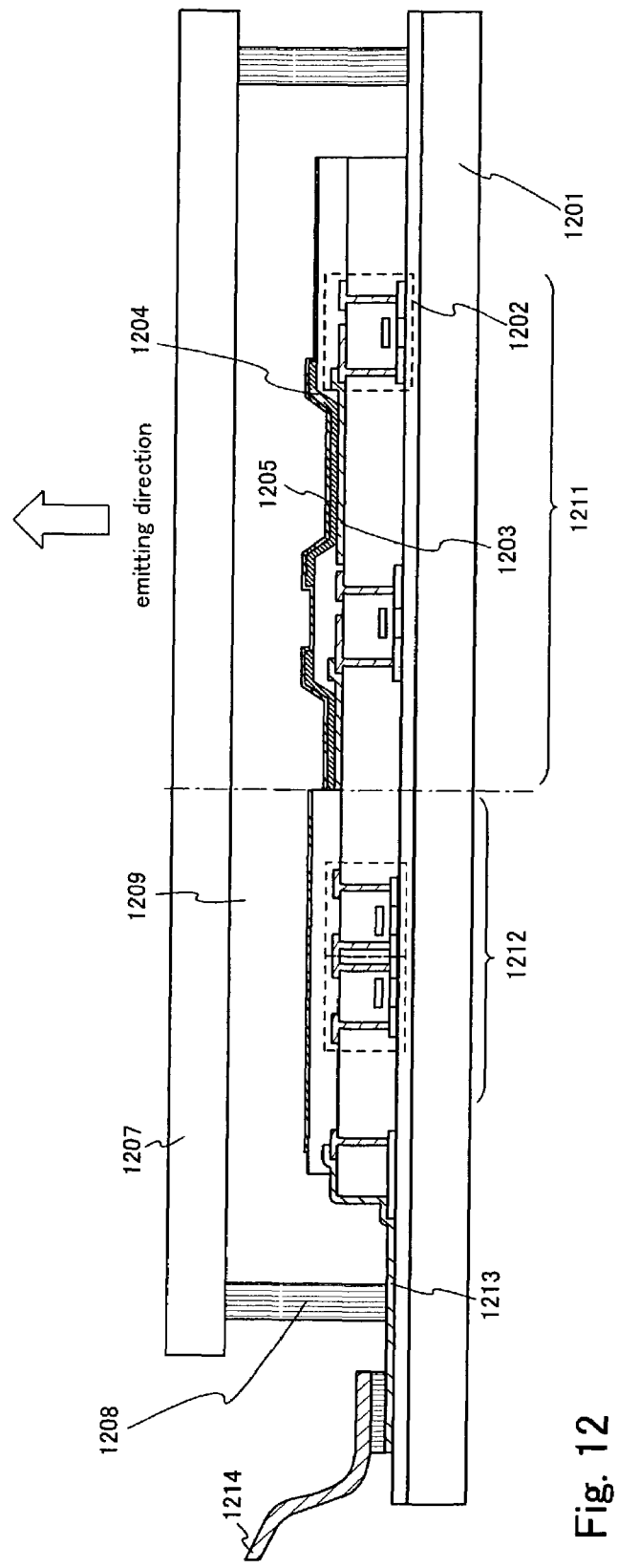
FIG. 12 is a view explaining an active-matrix light-emitting device.

This embodiment shows an active matrix light-emitting device as an example of a light-emitting device manufactured according to the present invention. Unlike Embodiment 1, in the light-emitting device of this embodiment, light is taken out from the opposite side of a substrate on which an active element is formed (hereinafter referred to as upward emission). FIG. 12 is a sectional view thereof.

A thin film transistor (hereinafter referred to as TFT) is used here as the active element, but the active element may be a MOS transistor. The TFT shown as an example is a top gate TFT (planar TFT, to be specific), but a bottom gate TFT (typically a reverse stagger TFT) may be used instead.

A substrate 1201, a current controlling TFT 1202 that is formed in a pixel portion 1211, and a driving circuit 1212 of this embodiment have the same structure as those of Embodiment 1.

A first electrode 1203, which is connected to a drain of the current controlling TFT 1202, is used as an anode in this embodiment, and therefore is formed preferably from a conductive material having a large work function. Typical examples of the conductive material include metals such as nickel, palladium, tungsten, gold, and silver. In this embodiment, the first electrode 1203 desirably does not transmit light. More desirably, the electrode is formed from a material that is highly reflective of light.

On the first electrode 1203, an organic compound film 1204 is formed. Provided on the organic compound film 1204 is a second electrode 1205, which serves as a cathode in this embodiment. Accordingly, the material of the second electrode 1205 is desirably a conductive material having a work function of 2.5 to 3.5 eV. Typically, a conductive film containing an alkaline metal element or an alkaline-earth metal element, or a conductive film containing aluminum, or a laminate obtained by layering an aluminum or silver film on one of the above conductive films is used. However, being light-transmissive is indispensable for the material of the second electrode 1205, because the upward emission is taken in this embodiment. Therefore, when used for the second electrode, the metal is preferably formed into a very thin film about 20 nm in thickness.

It is also possible to provide a protective film to protect the light-emitting element which composed of the first electrode 1203, the organic compound film 1204, and the second electrode 1205 from oxygen and moisture. In this embodiment, any material can be used for the protective film as long as it transmits light.

The first electrode (anode) 1203 is electrically connected to the current controlling TFT 1202 in FIG. 12 but the cathode may be connected to the current controlling TFT instead. In this case, the first electrode is formed from the material of the cathode whereas the second electrode is formed from the material of the anode. The current controlling TFT in this case is preferably an n-channel TFT.

Denoted by 1207 is a cover member and is bonded with a seal member 1208 formed of a resin. The cover member 1207 may be any material as long as it transmits light but not oxygen and water. In this embodiment, glass is used. An airtight space 1209 is filled with inert gas (typically, nitrogen gas or noble gas), a resin, or inert liquid (for example, liquid fluorocarbon typical example of which is perfluoro alkane). It is also effective to put an absorbent or deoxidant in the space.

Signals to be sent to the gate signal side driving circuit and the data signal side driving circuit are inputted from a TAB (tape automated bonding) tape 1214 through an input wiring line 1213. Though not shown in the drawing, the TAB tape 1214 may be replaced by a TCP (tape carrier package) that is obtained by providing a TAB tape with an IC (integrated circuit).

A polarizing plate may be provided on a display face (the face on which an image is displayed to be observed by a viewer) of the light-emitting device shown in this embodiment. The polarizing plate has an effect of reducing reflection of incident light from the external to thereby prevent the display face from showing the reflection of a viewer. Generally, a circular polarizing plate is employed. However, it is preferable for the polarizing plate to have a structure with less internal reflection by adjusting the index of refraction in order to prevent light emitted from the organic compound film from being reflected at the polarizing plate and traveling backward.

Embodiment 7

The light-emitting device fabricated in accordance with the present invention is of the self-emission type, and thus exhibits more excellent recognizability of the displayed image in a light place as compared to the liquid crystal display device. Furthermore, the light-emitting device has a wider viewing angle. Accordingly, various electronic devices can be completed by using the light-emitting device of the present invention to a display portion.

Such electronic devices manufactured by the present invention include a video camera, a digital camera, a goggles-type display (head mount display), a navigation system, a sound reproduction device (a car audio equipment, an audio set and the like), a laptop personal computer, a game machine, a portable information terminal (a mobile computer, a cellular phone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the light-emitting device with a light-emitting element is preferable, since the portable information terminal that is likely to be viewed from a tilted direction is often required to have a wide viewing angle. FIGS. 13A-H shows various specific examples of such electronic devices.

Figure 13A:
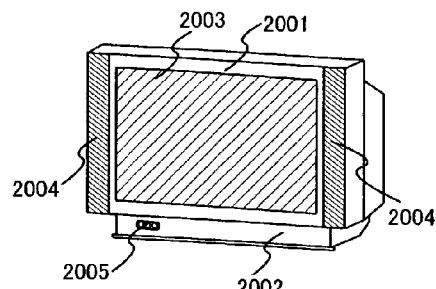
FIGS. 13A-13H are views showing an example of electronic appliances.

FIG. 13A illustrates a display device which includes a frame 2001, a support table 2002, a display portion 2003, a speaker portion 2004, a video input terminal 2005 or the like. The light-emitting device manufactured by the present invention can be used for the display portion 2003. The light-emitting device is of the self-emission type and therefore requires no backlight. Thus, the display portion thereof can have a thickness thinner than that of the liquid crystal display device. The display device is including all of the display device for displaying information, such as a personal computer, a receiver of TV broadcasting and an advertising display.

Figure 13B:
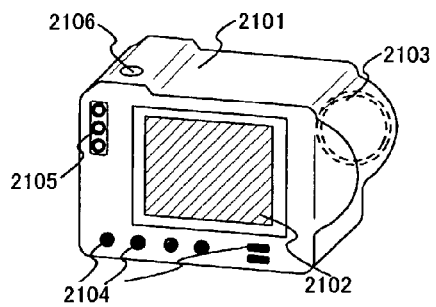

FIG. 13B illustrated a digital still camera which includes a main body 2101, a display portion 2102, an image receiving portion 2103, an operation key 2104, an external connection port 2105, a shutter 2106, or the like. The light-emitting device manufactured by the present invention can be used for the display portion 2102.

Figure 13C:
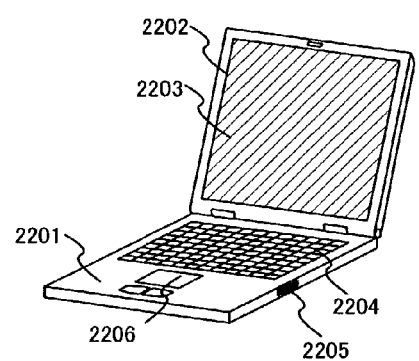

FIG. 13C illustrates a laptop type (notebook type) personal computer which includes a main body 2201, a casing 2202, a display portion 2203, a keyboard 2204, an external connection port 2205, a pointing mouse 2206, or the like. The light-emitting device manufactured by the present invention can be used to the display portion 2203.

Figure 13D:
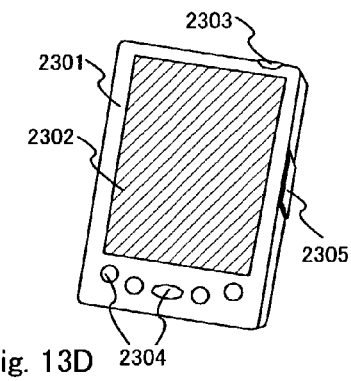

FIG. 13D illustrates a mobile computer which includes a main body 2301, a display portion 2302, a switch 2303, an operation key 2304, an infrared port 2305, or the like. The light-emitting device manufactured by the present invention can be used to the display portion 2302.

Figure 13E:
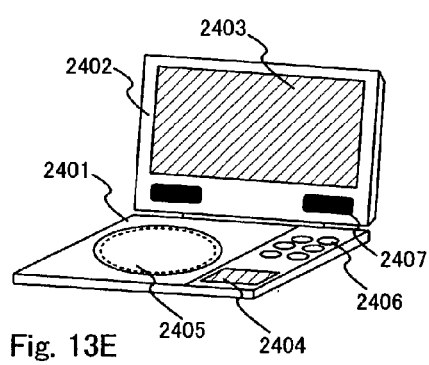

FIG. 13E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light-emitting device manufactured by the present invention can be used to the display potion A 2403 and the display portion B 2404. Note that the image reproduction apparatus including a recording medium further includes a domestic game machine or the like.

Figure 13F:
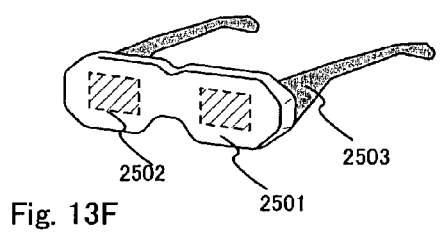

FIG. 13F illustrates a goggle type display (head mounted display) which includes a main body 2501, a display portion 2502, an arm portion 2503. The light-emitting device manufactured by the present invention can be used to the display portion 2502.

Figure 13G:
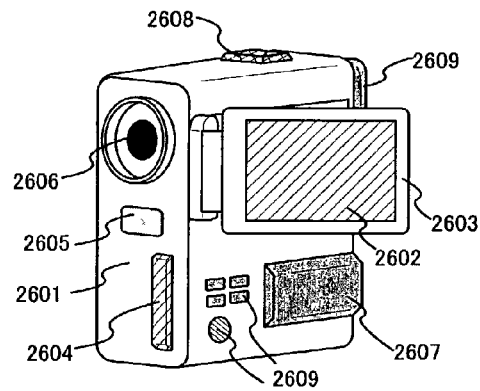

FIG. 13G illustrates a video camera which includes a main body 2601, a display portion 2602, an casing 2603, an external connecting port 2604, a remote control receiving portion 2605, an image receiving portion 2606, a battery 2607, a sound input portion 2608, an operation key 2609, an eyepiece potion 2610 or the like. The light-emitting device manufactured by the present invention can be used to the display portion 2602.

Figure 13H:
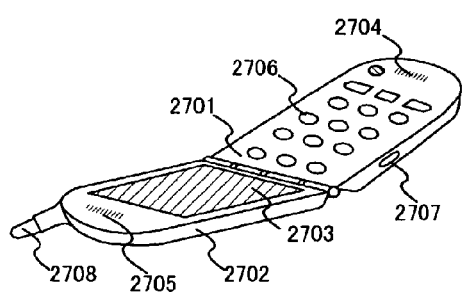

FIG. 13H illustrates a cellular phone which includes a main body 2701, a casing 2702, a display portion 2703, a sound input portion 2704, a sound output portion 2705, an operation key 2706, an external connecting port 2707, an antenna 2708, or the like. The light-emitting device manufactured by the present invention can be used to the display portion 2703. Note that the display portion 2703 can reduce power consumption of the cellular phone by displaying white-colored characters on a black-colored background.

When the brighter luminance of the organic material becomes available in the future, the light-emitting device manufactured by the present invention will be applicable to a front-type or rear-type projector in which light including output image information is enlarged by means of lenses or the like to be projected.

The aforementioned electronic devices are more likely to be used for display information distributed through a telecommunication path such as Internet, a CATV (cable television system), and in particular likely to display moving picture information. The light-emitting device is suitable for displaying moving pictures since the organic material can exhibit high response speed.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a cellular phone or a sound reproduction device, it is desirable to drive the light-emitting device so that the character information is formed by a light-emitting portion while a non-emission portion corresponds to the background.

As set forth above, the light-emitting device formed by using the present invention can be applied variously to a wide range of electronic devices in all fields. The electronic device in the present embodiment can be completed by using a light-emitting device shown in Embodiments 1 through 6 to the display portion.

By using a manufacturing method of the invention, it is possible to form an organic compound layer having a plurality of overlying polymer organic compounds and to selectively form light emitting elements respectively having a plurality of organic compound layers of different polymer organic compounds. Also, because the invention can use the conventional spin coat technique in film-forming a polymer organic compounds, it is possible to form an even film as compared to that of the ink jet technique. Furthermore, because of no necessity of preparing an exclusive apparatus, the invention is easy to carry out.

What is claimed is:

1. A method for manufacturing a light emitting device comprising:
   forming a thin film transistor over a substrate;
   forming a first electrode electrically connected to the thin film transistor;
   providing a mask having an opening over a surface of the substrate;
   aligning an application position over the first electrode with the opening;
   providing a plurality of magnets, which are arranged in a matrix form, on a back surface of the substrate to fix the mask by a magnetic force;
   applying an application liquid over the substrate by a spin coat technique to form an organic compound layer in the application position; and
   forming a second electrode over the organic compound layer,
   wherein the matrix form is aligned with the opening.

2. A method for manufacturing a light emitting device according to claim 1,
   wherein the mask comprises at least partly a magnetic material.

3. A method for manufacturing a light emitting device according to claim 1,
   wherein the mask is formed of iron, titanium, an alloy containing these, or martensitic or ferritic stainless steel.

4. A method for manufacturing a light emitting device according to claim 1,
   wherein the plurality of magnets are cast or sintered alnico magnet, ferrite magnet, iron magnet, chromium magnet, cobalt magnet, rare-earth cobalt magnet or neodymium-iron-boron based magnet.

5. A method for manufacturing a light emitting device according to claim 1,
   wherein the application liquid includes a polymer organic compound.

6. A method for manufacturing a light emitting device according to claim 1,
   wherein the application liquid is applied from a nozzle provided above the mask.

7. A method for manufacturing a light emitting device according to claim 1,
   wherein the plurality of magnets are alternately arranged such that adjacent magnets are reverse in magnetization direction.

8. A method for manufacturing a light emitting device comprising:
   forming a thin film transistor over a substrate;
   forming an electrode electrically connected to the thin film transistor;
   providing a mask having an opening over the electrode;
   aligning an application position over the electrode with the opening;
   providing a plurality of magnets, which are arranged in a matrix form, on a back surface of the substrate to fix the mask by a magnetic force; and
   applying an application liquid over the electrode by a spin coat technique to form an organic compound layer in the application position,
   wherein the matrix form is aligned with the opening.

9. A method for manufacturing a light emitting device according to claim 8,
   wherein the mask comprises at least partly a magnetic material.

10. A method for manufacturing a light emitting device according to claim 8,
    wherein the mask is formed of iron, titanium, an alloy containing these, or martensitic or ferritic stainless steel.

11. A method for manufacturing a light emitting device according to claim 8,
    wherein the plurality of magnets are cast or sintered alnico magnet, ferrite magnet, iron magnet, chromium magnet, cobalt magnet, rare-earth cobalt magnet or neodymium-iron-boron based magnet.

12. A method for manufacturing a light emitting device according to claim 8,
    wherein the plurality of magnets are alternately arranged such that adjacent magnets are reverse in magnetization direction.

13. A method for manufacturing a light emitting device according to claim 1,
    wherein, during mounting and demounting the plurality of magnets, an electromagnet is energized to reduce a magnetic field of the plurality of magnets.

14. A method for manufacturing a light emitting device according to claim 8,
    wherein, during mounting and demounting the plurality of magnets, an electromagnet is energized to reduce a magnetic field of the plurality of magnets.

* * * * *